United States Patent
Hussell et al.

(10) Patent No.: US 8,686,445 B1
(45) Date of Patent: Apr. 1, 2014

(54) SOLID STATE LIGHTING DEVICES AND METHODS

(75) Inventors: Christopher P. Hussell, Cary, NC (US); Amber C. Abare, Durham, NC (US); Jesse Colin Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 351 days.

(21) Appl. No.: 12/969,267

(22) Filed: Dec. 15, 2010

Related U.S. Application Data

(63) Continuation-in-part of application No. 12/479,318, filed on Jun. 5, 2009, now Pat. No. 7,923,739.

(51) Int. Cl.
*H01L 33/08* (2010.01)
(52) U.S. Cl.
USPC ........... 257/88; 438/28; 257/89; 257/E33.055
(58) Field of Classification Search
USPC .......... 257/88, 89, 98, 99, E33.055, E33.058; 438/27, 28
See application file for complete search history.

(56) References Cited

U.S. PATENT DOCUMENTS

| | | | |
|---|---|---|---|
| 4,679,118 A | 7/1987 | Johnson et al. |
| 4,946,547 A | 8/1990 | Palmour |
| 5,200,022 A | 4/1993 | Kong |
| 5,210,051 A | 5/1993 | Carter, Jr. |
| RE34,861 E | 2/1995 | Davis et al. |
| 5,393,993 A | 2/1995 | Edmond |
| 5,506,446 A | 4/1996 | Hoffman et al. |
| 5,523,589 A | 6/1996 | Edmond |
| 6,274,924 B1 | 8/2001 | Carey et al. |
| 6,498,355 B1 | 12/2002 | Harrah |
| 6,610,563 B1 | 8/2003 | Waitl |
| 6,828,170 B2 | 12/2004 | Roberts et al. |
| 6,936,855 B1 | 8/2005 | Harrah |
| 6,943,433 B2 | 9/2005 | Kamada |

(Continued)

FOREIGN PATENT DOCUMENTS

| CN | 200930286397.5 | 10/2010 |
|---|---|---|
| CN | ZL 2011-30010728 | 1/2012 |

(Continued)

OTHER PUBLICATIONS

Notification Concerning Availability of the Publication Serial No. PCT/US2012/024122 dated Aug. 16, 2012.

(Continued)

*Primary Examiner* — Roy Potter
(74) *Attorney, Agent, or Firm* — Jenkins, Wilson, Taylor & Hunt, P.A.

(57) ABSTRACT

A light emission package includes at least one solid state emitter, a leadframe including at least one electrical lead and a body structure encasing a portion of the leadframe. A thermal transfer material can be isolated from the at least one electrical lead. The body structure can include a plastic body structure wherein a rim portion can be disposed along a portion of the upper surface of the body structure. The light emission package can also include the at least one solid state emitter mounted over thermal transfer material using a direct metal-to-metal bond such as by eutectic die attachment. The light emission package is operable to emit light with an output of approximately 70% or greater of an initial light output for an extrapolated time of at least approximately 150,000 hours or more.

78 Claims, 14 Drawing Sheets

(56) References Cited

U.S. PATENT DOCUMENTS

| | | | |
|---|---|---|---|
| D514,073 S | 1/2006 | Suenaga |
| 7,081,661 B2 | 7/2006 | Takehara et al. |
| 7,224,047 B2 | 5/2007 | Carberry et al. |
| 7,244,965 B2 | 7/2007 | Andrews et al. |
| 7,249,790 B2 | 7/2007 | Condie et al. |
| D566,055 S | 4/2008 | Kim |
| 7,361,940 B2 | 4/2008 | Kim et al. |
| D573,113 S | 7/2008 | Bando |
| D573,114 S | 7/2008 | Min et al. |
| 7,400,049 B2 | 7/2008 | Shim |
| 7,432,589 B2 | 10/2008 | Yamamoto et al. |
| D580,375 S | 11/2008 | Yen |
| D580,381 S | 11/2008 | Bando |
| D580,891 S | 11/2008 | Sung et al. |
| 7,456,499 B2 | 11/2008 | Loh |
| 7,462,870 B2 | 12/2008 | Nakashima |
| D584,699 S | 1/2009 | Bando |
| D594,827 S | 6/2009 | Loh et al. |
| D595,675 S | 7/2009 | Wang et al. |
| 7,564,180 B2 | 7/2009 | Brandes |
| 7,566,159 B2 | 7/2009 | Oon et al. |
| D597,968 S | 8/2009 | Kobayakawa et al. |
| D597,971 S | 8/2009 | Kobayakawa et al. |
| D598,400 S | 8/2009 | Bando |
| 7,592,638 B2 | 9/2009 | Kim |
| 7,659,551 B2 | 2/2010 | Loh |
| D614,592 S | 4/2010 | Hussell et al. |
| 7,692,206 B2 | 4/2010 | Loh |
| D615,504 S | 5/2010 | Keller et al. |
| 7,719,024 B2 | 5/2010 | Bando |
| D621,798 S | 8/2010 | Lu et al. |
| D621,799 S | 8/2010 | Hussell et al. |
| D622,680 S | 8/2010 | Lin et al. |
| 7,791,061 B2 | 9/2010 | Edmond et al. |
| D626,095 S | 10/2010 | Hsieh |
| D627,310 S | 11/2010 | Lin et al. |
| D628,541 S | 12/2010 | Lin |
| 7,852,015 B1* | 12/2010 | Yen et al. ........................ 315/291 |
| D632,267 S | 2/2011 | Chen et al. |
| D632,659 S | 2/2011 | Hseih |
| D634,284 S | 3/2011 | Ko et al. |
| D634,285 S | 3/2011 | Ko et al. |
| D634,286 S | 3/2011 | Ko et al. |
| D634,716 S | 3/2011 | Suzuki |
| D635,527 S | 4/2011 | Hussell et al. |
| 7,923,739 B2 | 4/2011 | Hussell |
| D641,719 S | 7/2011 | Hussell et al. |
| D643,819 S | 8/2011 | Joo |
| D648,686 S | 11/2011 | Hussell et al. |
| D648,687 S | 11/2011 | Joo et al. |
| D658,599 S | 5/2012 | Takahashi et al. |
| D659,657 S | 5/2012 | Hussell et al. |
| D661,264 S | 6/2012 | Joo et al. |
| D667,801 S | 9/2012 | Joo et al. |
| 8,269,244 B2 | 9/2012 | Hussell |
| 8,354,992 B2 | 1/2013 | Rumreich et al. |
| D679,842 S | 4/2013 | Joo et al. |
| 8,497,522 B2 | 7/2013 | Hussell |
| 2001/0045640 A1 | 11/2001 | Oida et al. |
| 2002/0004251 A1 | 1/2002 | Roberts et al. |
| 2004/0075100 A1 | 4/2004 | Bogner et al. |
| 2004/0079957 A1 | 4/2004 | Andrews et al. |
| 2004/0126913 A1 | 7/2004 | Loh |
| 2006/0118808 A1 | 6/2006 | Sadamu et al. |
| 2006/0157726 A1 | 7/2006 | Loh et al. |
| 2006/0186418 A1 | 8/2006 | Edmond et al. |
| 2006/0220050 A1 | 10/2006 | Higaki et al. |
| 2007/0052074 A1 | 3/2007 | Hasegawa |
| 2007/0057364 A1 | 3/2007 | Wang et al. |
| 2007/0075325 A1 | 4/2007 | Baek et al. |
| 2007/0114514 A1 | 5/2007 | Shin |
| 2008/0006837 A1 | 1/2008 | Park et al. |
| 2008/0023722 A1 | 1/2008 | Lee et al. |
| 2008/0185605 A1 | 8/2008 | Wada et al. |
| 2008/0258130 A1 | 10/2008 | Bergmann et al. |
| 2008/0258162 A1 | 10/2008 | Koung et al. |
| 2008/0278941 A1 | 11/2008 | Logan et al. |
| 2008/0283849 A1* | 11/2008 | Imai ................................ 257/89 |
| 2008/0290353 A1 | 11/2008 | Medendorp et al. |
| 2009/0008662 A1 | 1/2009 | Ashdown et al. |
| 2009/0101921 A1 | 4/2009 | Lai |
| 2009/0122533 A1 | 5/2009 | Brukilacchio |
| 2009/0159905 A1 | 6/2009 | Chen |
| 2009/0189178 A1 | 7/2009 | Kim et al. |
| 2009/0267085 A1 | 10/2009 | Lee et al. |
| 2009/0321779 A1 | 12/2009 | Chang et al. |
| 2010/0059783 A1 | 3/2010 | Chandra |
| 2010/0102345 A1 | 4/2010 | Sung et al. |
| 2010/0133554 A1 | 6/2010 | Hussell |
| 2010/0133578 A1 | 6/2010 | Pickard et al. |
| 2010/0155748 A1 | 6/2010 | Chan et al. |
| 2010/0163887 A1 | 7/2010 | Kim et al. |
| 2010/0181582 A1 | 7/2010 | Li et al. |
| 2010/0270577 A1 | 10/2010 | Rulkens et al. |
| 2011/0006658 A1 | 1/2011 | Chan |
| 2011/0031865 A1 | 2/2011 | Hussell et al. |
| 2011/0180827 A1 | 7/2011 | Hussell |
| 2011/0186873 A1 | 8/2011 | Emerson |
| 2011/0316022 A1 | 12/2011 | Hussell |
| 2012/0069560 A1 | 3/2012 | Miskin et al. |
| 2012/0127720 A1 | 5/2012 | Hussell et al. |
| 2012/0153317 A1 | 6/2012 | Emerson et al. |
| 2013/0003375 A1 | 1/2013 | Hussell |
| 2013/0011946 A1 | 1/2013 | Hussell |

FOREIGN PATENT DOCUMENTS

| | | |
|---|---|---|
| CN | ZL201130171313.0 | 4/2012 |
| EP | 001242234 | 1/2011 |
| EP | 2 438 631 | 4/2012 |
| EP | 2 603 930 | 6/2013 |
| EP | 2 628 196 | 8/2013 |
| JP | D1102760 | 3/2001 |
| JP | 2005-179147 | 7/2005 |
| JP | 2005-209763 | 8/2005 |
| JP | 2007-108547 | 4/2007 |
| JP | 2008-091792 | 4/2008 |
| JP | 2008-103480 | 5/2008 |
| JP | 2008-545269 | 12/2008 |
| JP | D1346959 | 12/2008 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 1020070000130 A | 1/2007 |
| KR | 10-0845856 | 7/2008 |
| KR | 1020090003378 A | 1/2009 |
| KR | 30-0681227 | 2/2013 |
| KR | 30-0697636 | 6/2013 |
| TW | 100305347 | 3/2012 |
| TW | D146222 | 4/2012 |
| TW | D148144 | 7/2012 |
| WO | WO 2007/126720 | 11/2007 |
| WO | WO 2008/021268 | 2/2008 |
| WO | WO 2012/109225 | 12/2008 |
| WO | WO-2010/141215 | 3/2011 |
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/151270 | 11/2012 |

OTHER PUBLICATIONS

Certificate of Design Patent for Chinese Application Serial No. CN ZL 201130171313 dated May 7, 2012.
Certificate of Design Patent for Application Serial No. CN ZL 201130210595 dated Jun. 11, 2012.
Certificate of Design Patent for Application Serial No. CN ZL 201030577293 dated Jun. 11, 2012.

(56) References Cited

OTHER PUBLICATIONS

International Search Report for Application Serial No. PCT/US2012/023285 dated Jun. 27, 2012.
International Search Report and Written Opinion for Application Serial No. PCT/US2012/024122 dated Jul. 11, 2012.
Korean Office Action for Application Serial No. KR 30-2010-0047048 dated Dec. 15, 2011.
Korean Office Action for Application Serial No. KR 30-2010-0047049 dated Dec. 15, 2011.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notification Concerning Availability of the Publication Serial No. PCT/US2012/023285 dated Aug. 9, 2012.
Korean Office Action for Application Serial No. KR 30-2010-0047049 dated Sep. 12, 2012.
Hyun-Ho Kim et al., Thermal Transient Characteristics of Die Attach in High Power LED PKG, Microelectronics Reliability, vol. 48, Issue 3, Mar. 2008, pp. 445-454.
Description Model No. NS6x083x issued by Nichia Corporation—at least as early as Feb. 17, 2007.
Description Model No. NS6G083 issued by Nichia Corporation—at least as early as Aug. 31, 2007.
Notice of Allowance dated Apr. 16, 2010 from U.S. Appl. No. 29/338,186.
Design U.S. Appl. No. 29/360,791, filed Apr. 30, 2010.
Non-Final Office Action for U.S. Appl. No. 12/479,318 dated Jun. 2, 2010.
Related Design U.S. Appl. No. 29/365,939, filed Jul. 16, 2010.
U.S. Appl. No. 12/853,812, filed Aug. 10, 2010.
Notice of Allowance for U.S. Appl. No. 29/353,652 dated Aug. 24, 2010.
U.S. Appl. No. 61/404,985, filed Oct. 13, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
U.S. Appl. No. 12/969,267, filed Dec. 15, 2010.
Notice of Allowance for U.S. Appl. No. 29/360,791 dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application Serial No. 001283600-0001-0003 dated Jan. 7, 2011.
U.S. Appl. No. 13/011,609, filed Jan. 21, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Japanese Office Action for JP2010-026185 dated Apr. 5, 2011.
Notice of Allowance for Design U.S. Appl. No. 29/360,791 dated Apr. 12, 2011.
Notice of Allowance for Design U.S. Appl. No. 29/365,939 dated Apr. 12, 2011.
Supplemental Notice of Allowance for Design U.S. Appl. No. 29/338,186 dated May 20, 2011.
Taiwanese Office Action for Appl. No. 099305566 dated Jul. 12, 2011.
Notice of Allowance for Design U.S. Appl. No. 29/360,791 dated Jul. 21, 2011.
Notice of Allowance for Design U.S. Appl. No. 29/380,549 dated Jul. 28, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct. 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Design U.S. Appl. No. 29/338,186, filed Jun. 5, 2009.
Co-pending U.S. Appl. No. 12/498,856, filed Jul. 7, 2009.
Design U.S. Appl. No. 29/353,652, filed Jan. 12, 2010.
Related CIP U.S. Appl. No. 12/969,267, filed Dec. 15, 2010 entitled "Solid State Lighting Devices and Methods" (Filed With Non-Publication Request).
Non-Final Office Action for Korean Application Serial No. KR 30-2010-0047048 dated Dec. 15, 2011.
Non-Final Office Action for Korean Application Serial No. KR 30-2010-0047049 dated Dec. 15, 2011.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.
Notice of Allowance for U.S. Appl. No. 29/401,692 dated Jan. 20, 2012.
Notice of Allowance for U.S. Appl. No. 29/403,433 dated Feb. 2, 2012.
International Search Report for Application Serial No. TW 100305347 dated Mar. 5, 2012.
Japanese Notice of Allowance for Application Serial No. JP 2011-017747 dated Mar. 13, 2012.
Communication of European publicaton number and informaton on the applicaton of Arcle 67(3) EPC dated Mar. 14, 2012.
Non-Final Office Action for U.S. Appl. No. 13/082,699 dated Apr. 13, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for Application Serial No. PCT/US2011/054560 dated May 22, 2012.
Supplemental Notice of Allowance for U.S. Appl. No. 29/397,017 dated Jul. 23, 2012.
Non-Final Office Action for U.S. Appl. No. 13/616,759 dated Jul. 11, 2013.
Notice of Allowance for U.S. Appl. No. 12/825,075 dated Jul. 31, 2013.
Notice of Allowance for U.S. Appl. No. 13/462,450 dated Aug. 1, 2013.

(56) References Cited

OTHER PUBLICATIONS

Notice of Allowance from U.S. Appl. No. 29/330,657 dated Sep. 25, 2009.
Taiwanese Notice of Allowance for Application No. 100305347 dated Mar. 23, 2012.
Restriction Requirement for U.S. Appl. No. 29/382,394 dated Jul. 17, 2012.
Notice of Allowance for U.S. Appl. No. 13/082,699 dated Oct. 23, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.
Non-Final Office Action for U.S. Appl. No. 13/462,450 dated Jan. 15, 2013.
Non-Final Office Action for U.S. Appl. No. 12/825,075 dated Feb. 1, 2013.
Non-Final Office Action for U.S. Appl. No. 13/227,961 dated Mar. 26, 2013.
Notice of Allowance for U.S. Appl. No. 13/082,699 dated Apr. 3, 2013.
Korean Notice of Allowance for Application No. 30-2010-0047049 dated Apr. 4, 2013.
Non-Final Office Action for U.S. Appl. No. 13/011,609 dated Jun. 7, 2013.

\* cited by examiner

SOLID STATE LIGHTING DEVICES AND METHODS

CROSS REFERENCE TO RELATED APPLICATIONS

This application is a continuation-in-part of and claims benefit to U.S. Utility patent application Ser. No. 12/479,318, filed Jun. 5, 2009, now U.S. Pat. No. 7,923,739 the entire content of which is incorporated by reference herein.

TECHNICAL FIELD

The present application relates generally to solid state light emitters. The present application relates specifically to packages for solid state light emitters and devices incorporating the same.

BACKGROUND

Solid state light sources may be utilized to provide white LED light (e.g., perceived as being white or near-white), as has been investigated as potential replacements for white incandescent lamps. A representative example of a white LED lamp includes a package of a blue light emitting diode chip, made of gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. Part of the blue light emitted from the blue LED chip passes through the phosphor, while part of the blue light emitted from the blue LED chip is absorbed by the phosphor, which becomes excited and emits a yellow light. The part of the blue light that is transmitted through the phosphor is mixed with the yellow light emitted by the phosphor. The viewer perceives the mixture of blue and yellow light as white light. As an alternative to phosphor-converted white light, red, blue, and green (RGB) solid state emitters may be operated in combination to produce light that is perceived as white.

A solid state lighting device may include, for example, an organic or inorganic light emitting diode ("LED") or a laser. Examples of packages as referenced above are disclosed in U.S. Patent Application Publication Nos. 2005/0269587, 2004/0126913, and 2004/0079957, which are commonly assigned to the same assignee of the present subject matter.

It is known to mount solid state light sources, such as semiconductor light emitting devices, in packages that may provide protection, color enhancement, focusing, and other utilities for light emitted by such sources. One example of a light emitting die package including at least one light emitting device, a molded body, a lead frame including multiple leads, a thermal transfer material, and a lens is disclosed in U.S. Pat. No. 7,456,499, which is commonly assigned to the same assignee of the present subject matter. The molded body is formed around portions of the leadframe and defines an opening on the top side of the device, with the opening surrounding a mounting pad for at least one LED device.

Despite availability of various solid state light packages in the marketplace, need remains for improved packages suitable for solid state illumination applications, to enhance light output performance, enhance thermal performance, improve device reliability, and to promote ease of manufacture.

SUMMARY

The present subject matter relates to solid state light emitters, including packages for solid state light emitters and devices incorporating same, and methods for forming solid state light emitter devices.

In one aspect, the present subject matter relates to a light emission package adapted for use with at least one solid state emitter. The package can comprise: a leadframe defining at least one electrical lead; a body structure encasing at least a portion of the leadframe; a thermal transfer material electrically isolated from the at least one electrical lead and retained by the body structure; and at least one light emitting diode (LED) mounted over heat transfer material. Further aspects of the package can comprise, for example, a package comprising a rim portion, a plastic body structure, a desirable die attach, and/or an extensive long term L70 lifetime and lifetime extrapolations.

It is, therefore, an object of the present disclosure to provide solid state lighting devices and methods of improving the manufacturability and lifetime of the devices. These and other objects of the present disclosure as can become apparent from the disclosure herein are achieved, at least in whole or in part, by the subject matter described herein.

DETAILED DESCRIPTION

Figure 1:
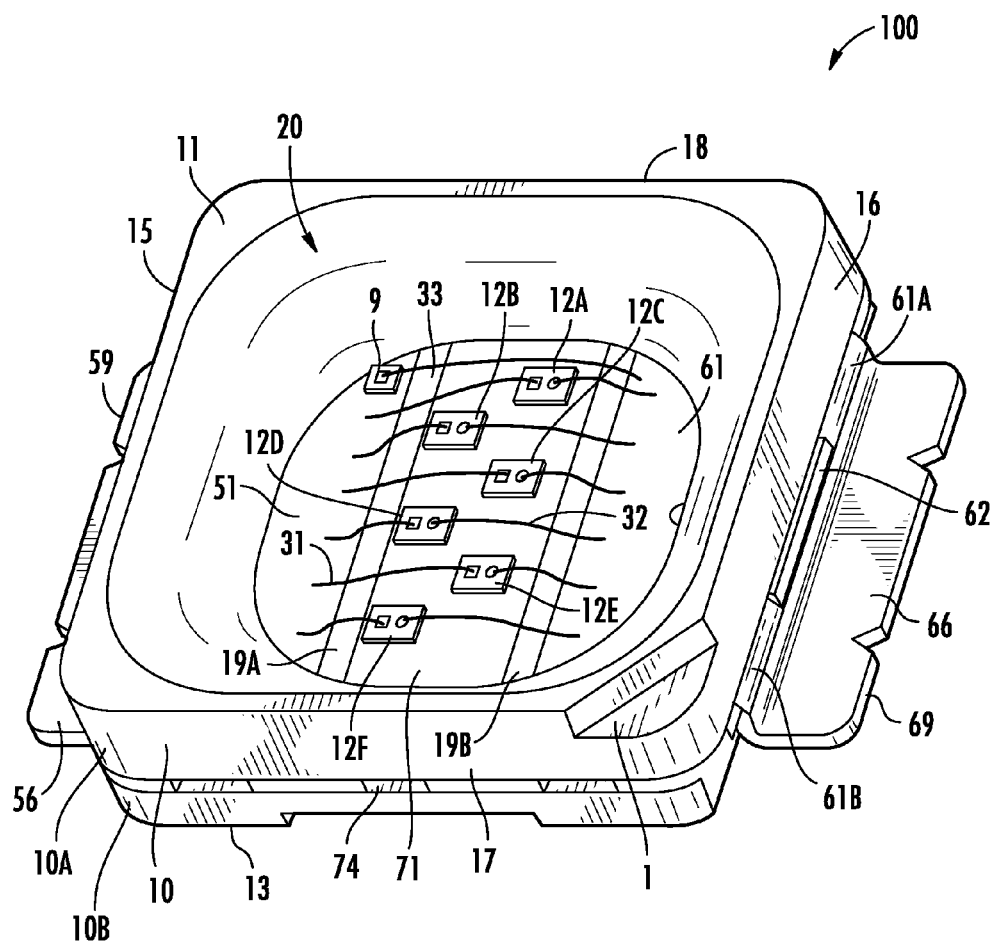
FIG. 1 is a perspective view showing top, side, and end portions of a solid state light emission package according to one embodiment of the present subject matter.

The present subject matter now will be described more fully hereinafter with reference to the accompanying drawings, in which embodiments of the subject matter are shown. The present subject matter may, however, be embodied in many different forms and should not be construed as limited to the specific embodiments set forth herein. Rather, these embodiments are provided to convey the scope of the subject matter to those skilled in the art. In the drawings, the size and relative sizes of layers and regions may be exaggerated for clarity.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, no intervening elements are present. It will also be understood that when an element is referred to as being "connected" or "coupled" to another element, it can be directly connected or coupled to the other element or intervening elements may be present. In contrast, when an element is referred to as being "directly connected" or "directly coupled" to another element, no intervening elements are present.

It will be understood that although the terms "first" and "second" are used herein to describe various regions, layers and/or portions, these regions, layers and/or portions should not be limited by these terms. These terms are only used to distinguish one region, layer or portion from another region, layer or portion. Thus, a first region, layer or portion discussed below could be termed a second region, layer or portion, and similarly, a second region, layer or portion may be termed a first region, layer or portion without departing from the teachings of the present subject matter.

Furthermore, relative terms, such as "lower" or "bottom" and "upper" or "top," may be used herein to describe relationship of one or more elements to other elements as illustrated in the Figures. It will be understood that relative terms are intended to encompass different orientations of the device in addition to the orientation depicted in the Figures. For example, if a device in the Figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The terms "below" or "beneath" can therefore encompass both an orientation of above and below.

Unless otherwise defined, terms (including technical and scientific terms) used herein should be construed to have the same meaning as commonly understood by one of ordinary skill in the art to which this subject matter belongs. It will be further understood that terms used herein should be interpreted as having a meaning that is consistent with their meaning in the context of this specification and the relevant art, and should not be interpreted in an idealized or overly formal sense unless expressly so defined herein.

As used herein, the terms solid state light emitter or solid state light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the subject matter may include III-V nitride (e.g., gallium nitride) based LEDs or lasers fabricated on a silicon carbide substrate, such as those devices manufactured and sold by Cree, Inc. of Durham, N.C. Such LEDs and/or lasers may be configured to operate such that light emission occurs through the substrate in a so-called "flip chip" orientation.

Solid state light emitters may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called 'lumiphoric') materials in LED devices may be accomplished by adding such materials to encapsulants, adding such materials to lenses, or by direct coating onto LEDs. Other materials, such as dispersers and/or index matching materials may be included in such encapsulants.

Referring now to FIGS. 1-6, a solid state light emitter package 100 according to certain embodiments of the present subject matter includes a body structure 10 defining a body cavity (preferably reflective to constitute a reflector cavity) 20 containing six solid state emitters 12A-12F. Each emitter 12A-12F is arranged over (i.e., on or adjacent to) the upper surface 71 of a thermal transfer material 70 disposed along the floor of the reflector cavity 20, and each emitter 12A-12F is disposed in electrical communication with a first electrical lead 51 and a second electrical lead 61 using wirebonds 31, 32. In one embodiment, the emitters 12A-12F may be mounted on an optional submount (not shown) arranged between the emitters 12A-12F and the thermal transfer material 70. In one aspect, the emitters 12A-12F comprise LEDs. The thermal transfer material 70 can be separated from (and preferably electrically isolated from) each of the electrical leads 51, 52 via body portions 19A, 19B, and can be adapted to conduct heat away from the emitters 12A-12F to a lower surface 72 of the thermal transfer material 70 for dissipation therefrom. In one aspect, thermal transfer material 71 comprises a heatsink directing heat away from the one or more LEDs and to an external source such as, for example, a printed circuit board (PCB) or a metal core printed circuit board (MCPCB). An electrostatic discharge protection device 9 (e.g., a zener diode, or alternatively, a ceramic capacitor, transient voltage suppression (TVS) diode, multilayer varistor, and/or Schottky diode) arranged on the first electrical lead 51 and having an associated wirebond 33 is also disposed in electrical communication with the emitters 12A-12F. The electrical leads 51, 61 can extend through exterior side walls 15, 16 disposed at opposing ends of the body structure 10, with lead tab portions 56, 66 extending away from the exterior side walls 15, 16 in a direction outward from a center portion of the package 100, to enable the lead tab portions 56, 66 to be soldered or otherwise connected to a current source and sink (not shown) to permit operation of the emitters 12A-12F.

Figure 6:
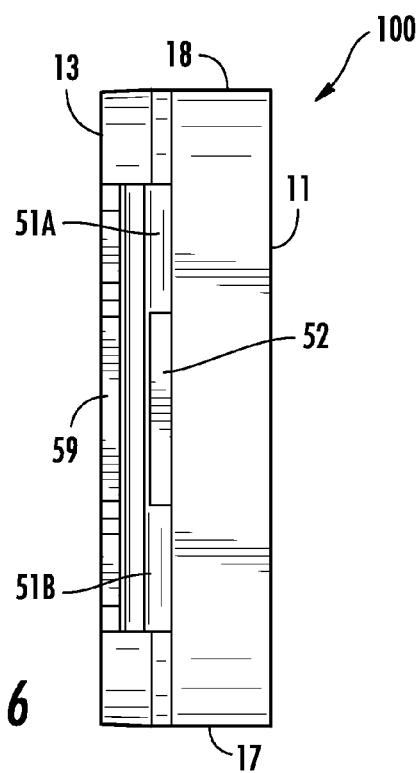
FIG. 6 is an end elevation view of the solid state light emission package of FIGS. 1-5.

The body structure 10 can comprise an upper face 11, lower face 13, and exterior side walls 15-18. The upper face 11 defines a corner notch 1, and the lower face 13 can comprise a recess 2 containing the thermal transfer material 70, with a lower surface 72 and lower protrusion 72A of the thermal transfer material 70 being exposed. In one embodiment, the body structure 10 has a length and a width (e.g., as represented by exterior side walls 15-18) that are substantially equal, such that the body structure 10 has a square-shaped footprint. In another embodiments, the length and width of the body structure 10 may be unequal, with the body structure having a rectangular footprint, or the body structure 10 may be formed in other shapes (e.g., round), including footprints conforming to regular polygonal shapes (e.g., octagonal), or footprints of other shapes not constituting regular polygons. The body structure 10 is preferably formed around a leadframe 50 (defining electrical leads 51, 61) and the thermal transfer material 70 (as illustrated in FIG. 6), with the body structure 10 encasing at least a portion of the leadframe 50 and arranged to retain the thermal transfer material 70. Protruding portions 73, 74 of the thermal transfer material 70 may be exposed along side walls 17, 18 of the body structure 10. The body structure 10 may be advantageously formed using a molding process, such as injection molding, using a thermoplastic and/or thermoset material that is preferably electrically insulating. Polymer-containing materials can be used to form the body structure 10, with such materials optionally being reinforced (e.g., with fibers, ceramics, or composites). The body structure may be white or light in color to minimize dark appearance of the package 100. Ceramic and/or composite materials may be utilized in place of polymers to form the body structure 10 in certain embodiments. As an alternative to injection molding, other types of molding and/or forming processes (e.g., sintering) may be used. The body structure 10 may include an upper portion 10A and lower portion 10B (e.g., as may be formed in upper and lower molding die portions (not shown), respectively). The reflector cavity 20 may be formed as the inverse of a central protrusion in an upper molding die.

Figure 3:
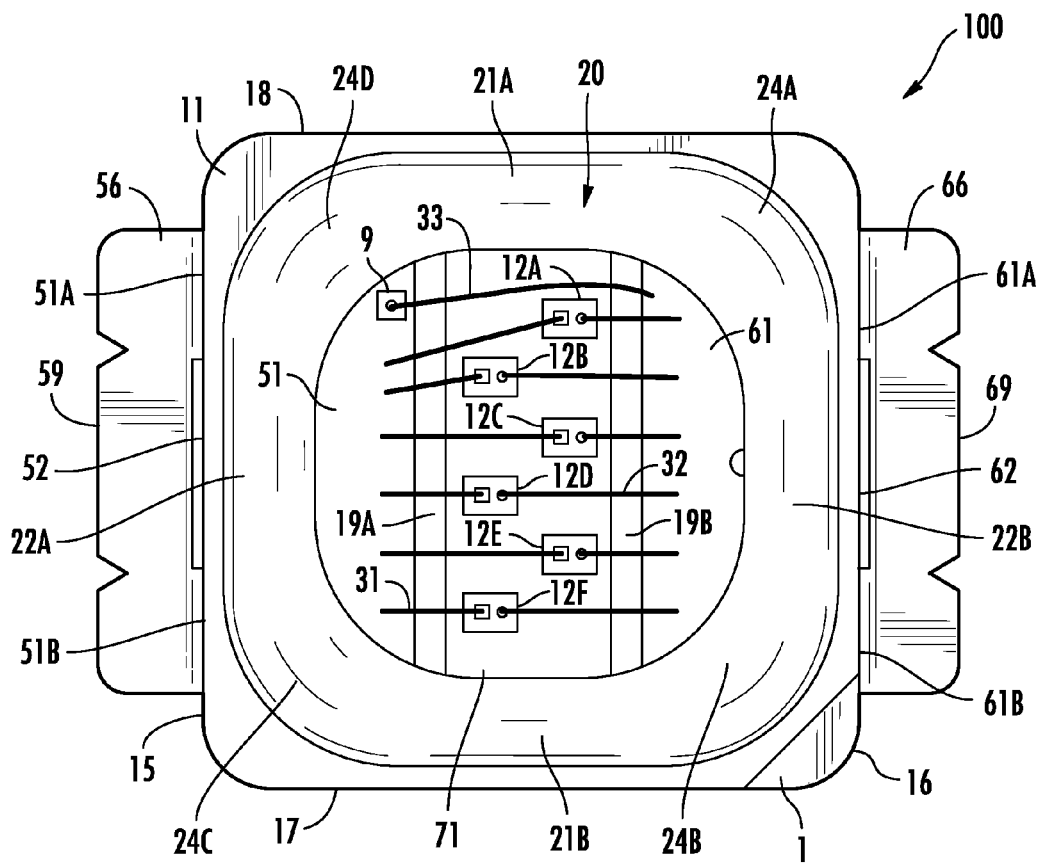
FIG. 3 is a top plan view of the solid state light emission package of FIGS. 1-2.
Figure 7:
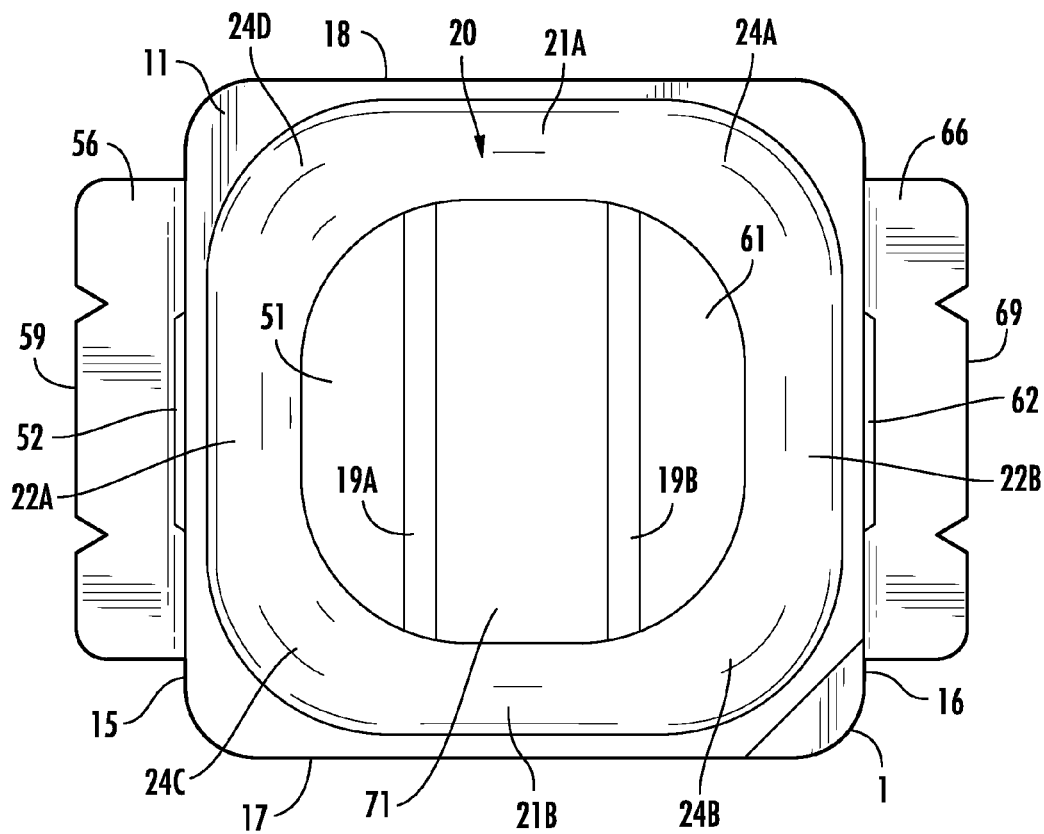
FIG. 7 is a top plan view of a package subassembly prior to complete fabrication of the solid state light emission package of FIGS. 1-6.
Figure 8A:
FIG. 8A is a simplified schematic cross-sectional view of a body portion of the package subassembly of FIG. 7, illustrating the angle of a side wall or end wall portion thereof.
Figure 8B:
FIG. 8B is a simplified schematic cross-sectional view of a body portion of the package subassembly of FIG. 7, illustrating the angle of a transition wall portion thereof.

Referring to FIGS. 3 and 7, the reflector cavity 20 is bounded from below by a floor (including portions of the contacts 51, 61, body portions 19A, 19B, and an upper surface 71 of the thermal transfer material 70), and bounded along edges by side wall portions 21A, 21B, end wall portions 22A, 22B, and transition wall portions 24A-24D. A transition wall portion 24A-24D is disposed between each respective side wall portion 21A, 21B and end wall portion 22A, 22B. Each side wall portion 21A, 21B and each end wall portion 22A, 22B preferably includes a substantially straight upper edge, and each transition wall portion 24A-24D preferably includes a curved or segmented upper edge transitioning from the upper edge of a side wall portion 21A, 21B to the upper edge of an end wall portion 22A, 22B. Each transition wall portion 24A-24D is preferably inclined at a larger average angle, relative to a plane perpendicular to the floor of the reflector cavity, than each side wall portion 21A, 21B and each end wall portion 22A, 22B. For example, FIG. 8A provides a simplified schematic cross-sectional view of a body portion, illustrating the angle θ of a side wall portion or end wall portion thereof relative to a plane perpendicular to the floor of the body cavity. Similarly, FIG. 8B provides a simplified schematic cross-sectional view of a body portion, illustrating the angle φ of a transition wall portion relative to a plane perpendicular to the floor of the body cavity. In one embodiment, each side wall portion and each end wall portion is inclined at an angle θ of at least about 20 degrees; more preferably at least about 30 degrees; still more preferably at least about 40 degrees. In further embodiments, the angle θ may be at least about 45 degrees, or at least about 50 degrees. In one each transition wall portion is inclined at an angle φ of at least about 30 degrees; more preferably at least about 40 degrees; still more preferably at least about 50 degrees. In further embodiments, the angle φ may be at least about 55 degrees, or at least about 60 degrees. Such angles of the side wall portions 21A, 21B, end wall portions 22A, 22B, and transition wall portions 24A, 24D are greater than typically employed in solid state emitter devices. Although the side wall/end wall portions and transition wall portions are illustrated in FIGS. 8A-8B as being angular from the floor of the cavity to the upper edge of the package, in an alternative embodiment any one or more (or all) of these wall portions may be characterized by a segmented and/or curved cross-section, that is, with the wall extending from the floor to the upper edge of the package being non-linear along at least a portion thereof. If such walls are curved or segmented, then the inclination angles mentioned above may correspond to an average angle of a curved or segmented wall, or an angle between endpoints of such a wall. Use of side wall portions 21A, 21B/end wall portions 22A, 22B and transition wall portions 24A-24D of alternating angles enables frontal area of the reflector cavity 20 maximized relative to the square-shaped upper surface 11, while providing desirably diffuse output beam characteristics, particularly when multiple emitters are disposed in the cavity 20.

Figure 10:
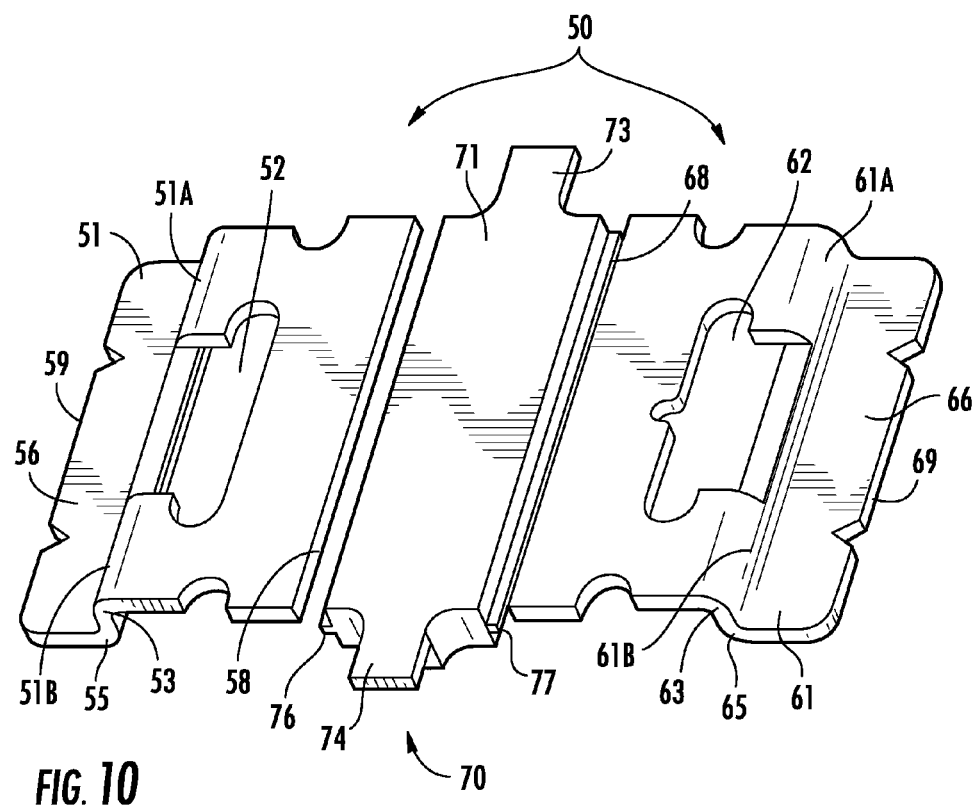
FIG. 10 is a perspective view showing top, side, and end portions of a leadframe and thermal transfer material of the solid state light emission package of FIGS. 1-6 and the package subassembly of FIG. 7-8.
Figure 11:
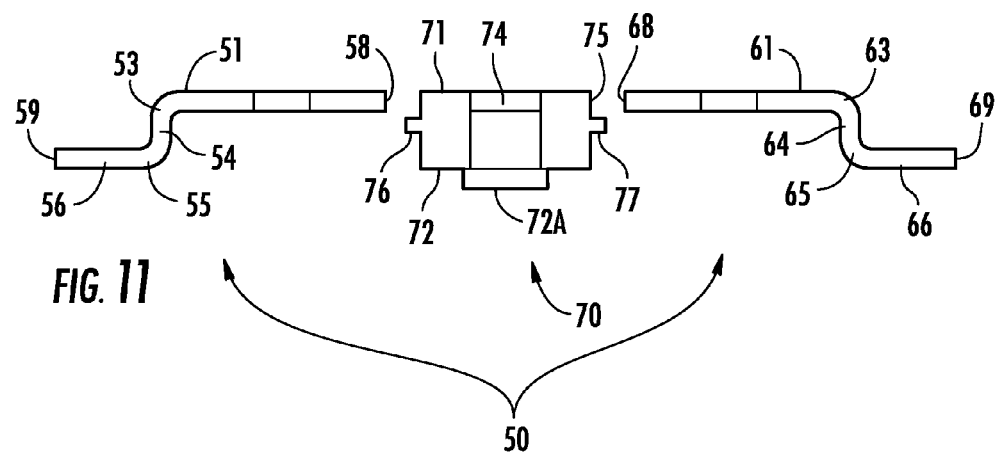
FIG. 11 is a side elevation view of the leadframe and thermal transfer material of FIG. 10.

As indicated previously, the body structure 10 is preferably formed around the leadframe 50 and thermal transfer material 70. Referring to FIGS. 10-11, the leadframe 50 includes a first electrical lead 51 and a second electrical lead 61. Each electrical lead 51, 61 includes a medial end 58, 68, and a lead tab portion 56, 66 extending away from a center of the emitter package and terminating at a distal end 59, 69. Each electrical lead 51, 61 defines at least one aperture 52, 62 that serves to separate multiple electrical lead segments 51A-51B, 61A-62B. In one embodiment, each electrical lead 51, 61 may include multiple apertures serving to separate more than two (e.g., three or more) electrical lead segments. A portion of each aperture 52, 62 is preferably filled with body material of the body structure, with another portion of each aperture 52, 62 being disposed outside the side walls 15, 16 of the body structure 10, such that individual electrical lead segments 51A-51B, 61A-61B are separated from corresponding electrical lead segments 51A-51B, 61A-61B by the apertures 52, 62 along exterior side walls 15, 16 of the body structure 10. Each electrical lead 51, 61 includes a first bend 53, 63, a bent portion 54, 64 (that is preferably substantially perpendicular to a plane extending through the medial ends 58, 68), and a second bend 55, 65 transitioning to each electrical lead tab portion 56, 66. Each aperture 52, 62 preferably extends at least into each first bend 53, 63. Each aperture 52, 62 provides multiple benefits. First, a medial portion of each aperture 52, 62 is filled with body material, and thus serves to promote secure retention of the electrical leads 51, 61 within the body structure 10. Second, each aperture 52, 62 serves to reduce the amount of lead material (e.g., metal) subject to being bent to form the first bend 53, 63. This reduces the amount of bending force required to form the first bend 53, 63, as is particularly desirable when the first bend 53, 63 is formed in each electrical lead 51, 61 after formation of the body structure 10 around the electrical leads 51, 61. Bending is preferably performed sufficiently to position at least a portion of each electrical lead 51, 61 in the recesses 5, 6.

Figure 2:
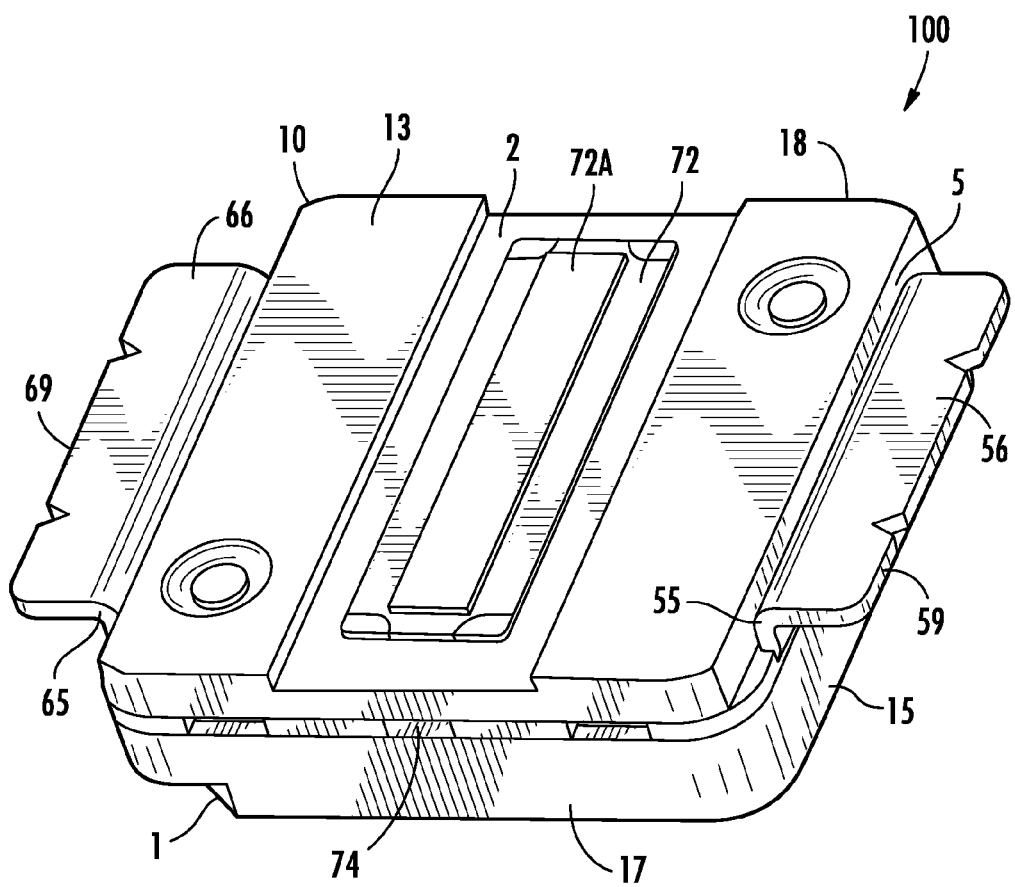
FIG. 2 is a perspective view showing bottom, side, and end portions of the solid state light emission package of FIG. 1.
Figure 4:
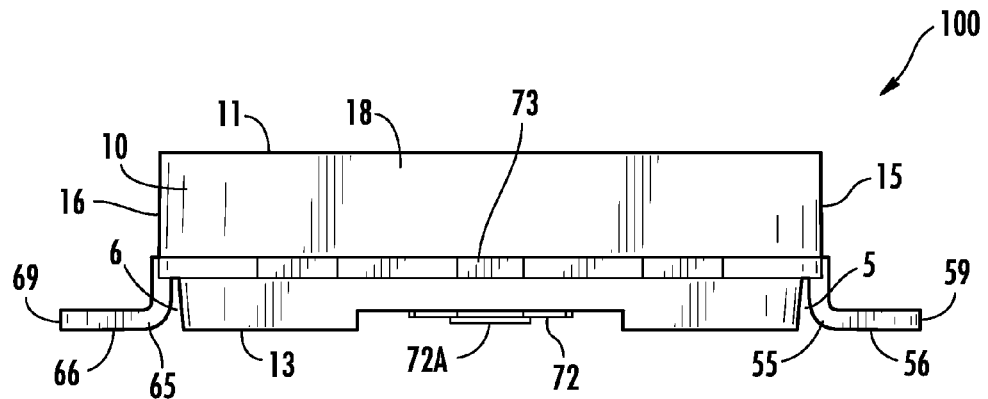
FIG. 4 is a side elevation view of the solid state light emission package of FIGS. 1-3.
Figure 9:
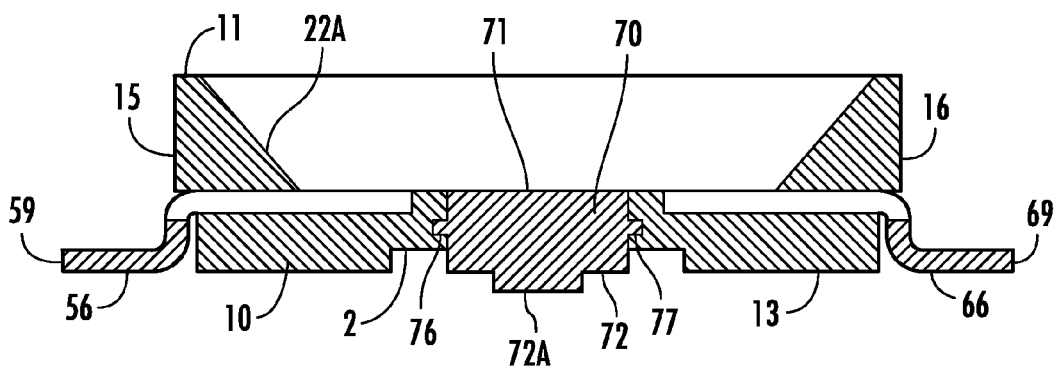
FIG. 9 is a side cross-sectional view of the subassembly of FIG. 7.

Continuing to refer to FIGS. 10-11, the thermal transfer material 70 includes an upper surface 71, a lower surface 72 including a downwardly-extending central protrusion 72A. The thermal transfer material 70 defines upper protrusions 73, 74 along ends of the upper surface 71, with such upper protrusions 73, 74 extending through side walls of the body structure 10 (as illustrated in FIGS. 1, 2, and 4) and being exposed along tips thereof. Side walls 75 of the thermal transfer material 70 further define protrusions 76, 77 that promote secure retention of the thermal transfer material 70 by the body structure 20 (as illustrated in FIG. 9), and also reduces potential for leakage (e.g., of flux or solder during manufacture of the emitter package 100, or of encapsulant (not shown) disposed in the cavity 20 during operation of the emitter package 100) along interfaces between the body structure 10 and the thermal transfer material 70. Such protrusions 76, 77 along side walls 75 of the thermal transfer material 70 may be varied in number, size, shape, and orientation (e.g. angled upward or downward).

The leadframe 50 may be stamped from a first flat sheet of metal or other conductive material. The thermal transfer material 70 may be stamped from a second flat sheet of metal or other conductive material, with the second sheet preferably being thicker than the first sheet to enable the resulting thermal transfer material 70 to have a substantially greater average thickness than the electrical leads 51, 61. Relative to an average thickness of the electrical leads 51, 61, an average thickness of the thermal transfer material 70 is preferably at least two times as thick, and more preferably at least about 2.5 times as thick. A multitude of leadframes may be defined in a single first sheet, and a multitude of thermal transfer materials may be defined in a second sheet, and body structure material may be formed around such first and second sheets to simultaneously form a multitude of emitter package subassemblies (e.g., such as the individual subassembly shown in FIGS. 8-9). Bends 53, 54, 63, 64 may be defined in electrical leads 51, 61 of each package subassembly after formation of the body structure. The multitude of emitter package subassemblies may be separated into individual package subassemblies by cutting adjacent to side walls 17, 18 and distal ends 59, 69 of the lead tab portions 56, 66. Such cutting exposes tips of the thermal transfer material protrusions 73, 74 along side walls 17, 18 of each emitter package 100.

Figure 5:
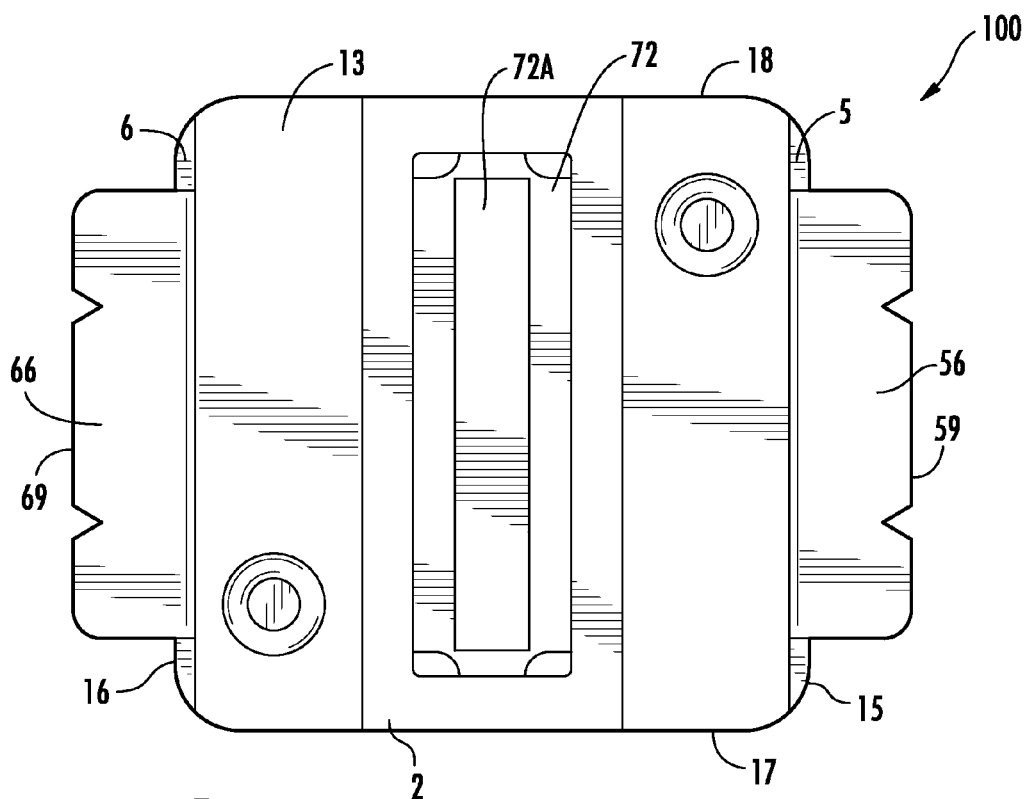
FIG. 5 is a bottom plan view of the solid state light emission package of FIGS. 1-4.

Referring to FIGS. 2, 4, and 5, recesses 5, 6 are preferably defined in exterior side walls 15, 16 of the body structure 10 adjacent to (e.g., below) locations where the leads 51, 61 extend through the exterior side walls 15, 16. Such recesses 5, 6 are preferably arranged to receive the bent portion (or at least part of the thickness of the bent portion) of each electrical lead 51, 61. Each recess 5, 6 has a depth relative to the corresponding exterior side wall 15, 16, with the depth of each recess 5, 6 preferably being at least as large as an average thickness of the electrical leads 51, 61. The recesses 5, 6 provide multiple benefits. First, the recesses 5, 6 eliminate presence of material immediately disposed below the first bends 53, 63, thereby reducing stress applied to the body structure 10 when the first bends 53, 63 are formed after the leadframe 50 (including electrical leads 51, 61) is retained in the body structure 10. Second, the recesses 5, 6 enable each first bend 53, 63 to have a tighter bending radius and reduce or eliminate outward extension of the bent portions 54, 64 (preferably substantially perpendicular to the lower body surface 13 and the electrical lead tab portions 56, 66) relative to the side walls 15, 16, thereby reducing the effective footprint of the light emission package 100. Reduction of effective footprint of emitter packages 100 enables such packages 100 to be mounted at higher density on an underlying substrate (not shown), and optionally overlaid with a Lambertian reflector or diffuser having reduced hole spacing (e.g., within a backlit display device, such as a LCD display), thereby enhancing lighting performance such as by enabling higher flux density and/or greater lighting uniformity.

Figure 12A:
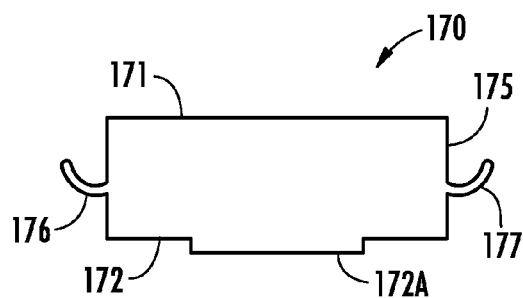
FIG. 12A is a cross-sectional schematic view of a thermal transfer material according to one embodiment and useable with a solid state light emission package as disclosed herein.
Figure 12B:
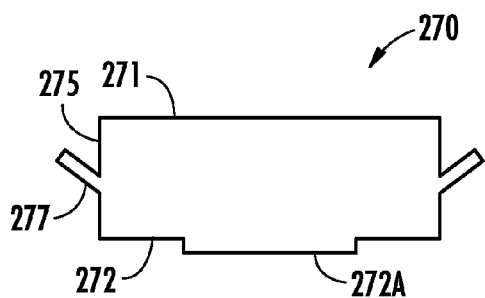
FIG. 12B is a cross-sectional schematic view of a thermal transfer material according to another embodiment and useable with a solid state light emission package as disclosed herein.
Figure 12C:
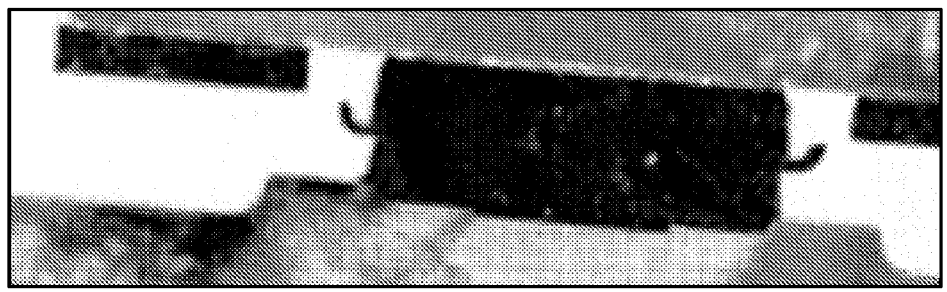
FIG. 12C is a cross-sectional view of a portion of a solid state light emission package according to one embodiment of the present subject matter, showing a thermal transfer material similar to the embodiment illustrated in FIG. 12A.

Referring to FIG. 12A, in one embodiment a thermal transfer material 170 for integration and use with a solid state emitter package (e.g., package 100) may include an upper surface 171, a lower surface 172, a lower protruding portion 172A, and curved lateral protrusions 176, 177 extending outward from side walls 175. A photograph showing a cross-section of a thermal transfer material with similarly curved lateral protrusions is shown in FIG. 12C. Referring to FIG. 12B, in another embodiment a thermal transfer material 270 may include an upper surface 271, a lower surface 272, a lower protruding portion 272A, and upwardly-angled lateral protrusions 276, 277 extending outward and upward from side walls 275. Downwardly-angled lateral protrusions may be employed in a similar embodiment (not shown). Any combinations of the foregoing lateral protrusions may be employed. Lateral protrusions may be formed by any suitable manufacturing method, including stamping, extrusion, milling, and the like. In further embodiments, the lateral protrusions may be replaced with, or supplemented by, recesses (not shown) in side walls of a thermal transfer material to provide similar sealing utility, with such recesses being formable by similar methods.

Figure 13:
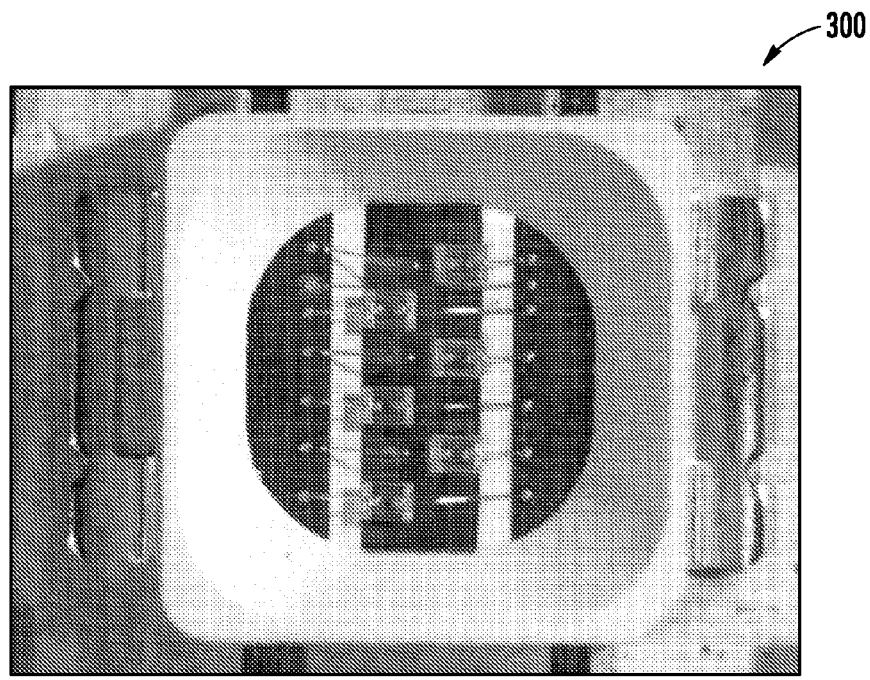
FIG. 13 is a top plan view of a solid state light emission package according to another embodiment of the present subject matter, the package lacking encapsulant in the reflector cavity for clarity of illustration.

FIG. 13 shows a top plan view photograph of a solid state emitter package 300 similar to the package 100 described hereinabove. To promote ease of viewing, such package 300 is devoid of encapsulant, diffuser, and/or lens material (as otherwise may be retained in the cavity to cover and/or protect the emitters and wirebonds, and to optionally interact with light emitted by the emitters), but it is to be understood that emitter packages as disclosed herein may desirably include encapsulant, diffuser and/or lens material, optionally including at least one lumiphor to interact with light emitted by the emitters and responsively emit light of a different wavelength. The package 300 according to the present embodiment differs from the package 100 according to a prior embodiment with respect to layout of the wirebonds (e.g., the wirebond of the electrostatic discharge device may extend to a second contact, rather than contacting a wirebond for an emitter), and with respect to size of the apertures defined in the electrical leads. As compared to the apertures 52, 62 defined in the electrical leads 51, 61, the apertures shown in FIG. 13 are larger.

Figure 14A:
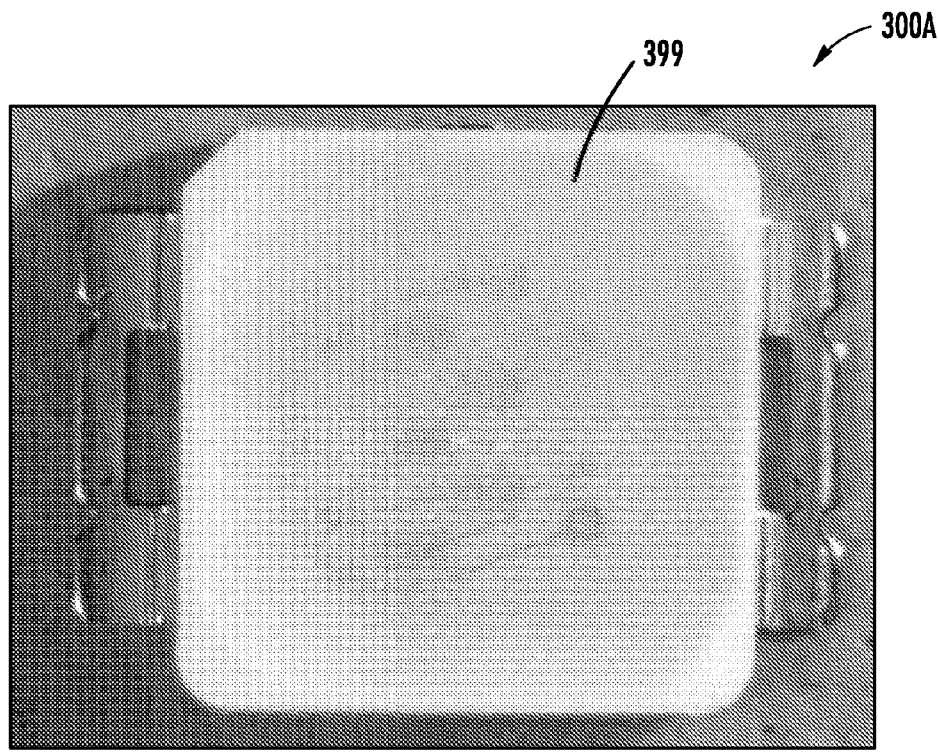
FIG. 14A is a top plan view of a solid state light emission package similar to the package of FIG. 13, but including encapsulant in the reflector cavity.
Figure 14B:
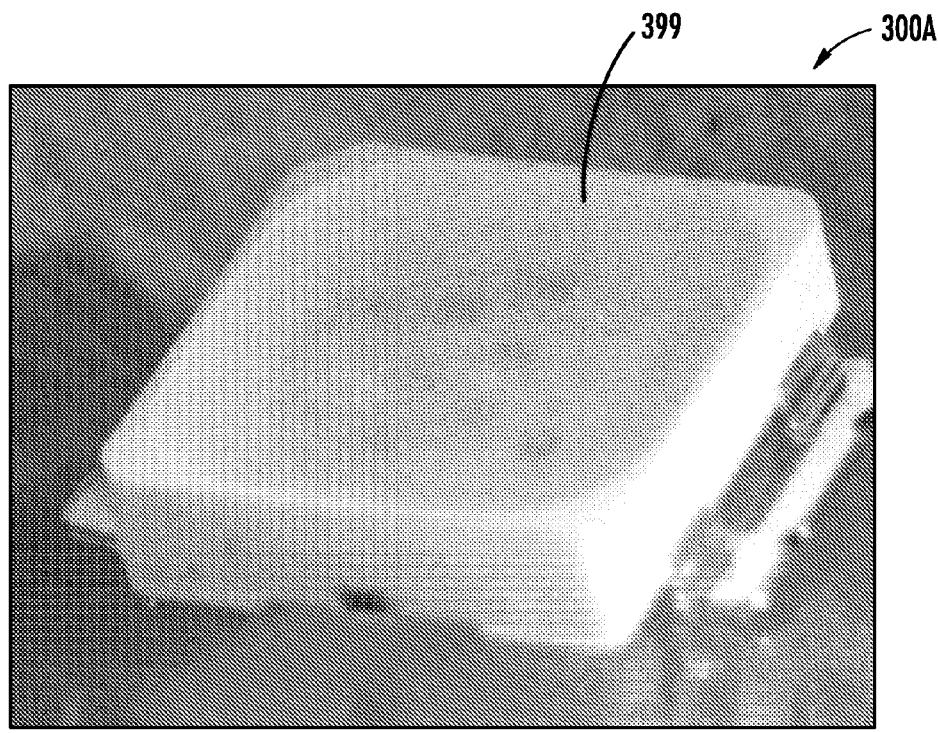
FIG. 14B is a perspective view showing top, side, and end portions of the solid state light emission package of FIG. 14A.

FIGS. 14A-14B depict a solid state light emission package 300A similar to the package 300 depicted in FIG. 13, but the package 300A includes encapsulant material 399 disposed within the cavity containing the emitters, and the wirebond arrangement in the package 300 differs from wirebond arrangements shown in prior embodiments.

Figure 15A:
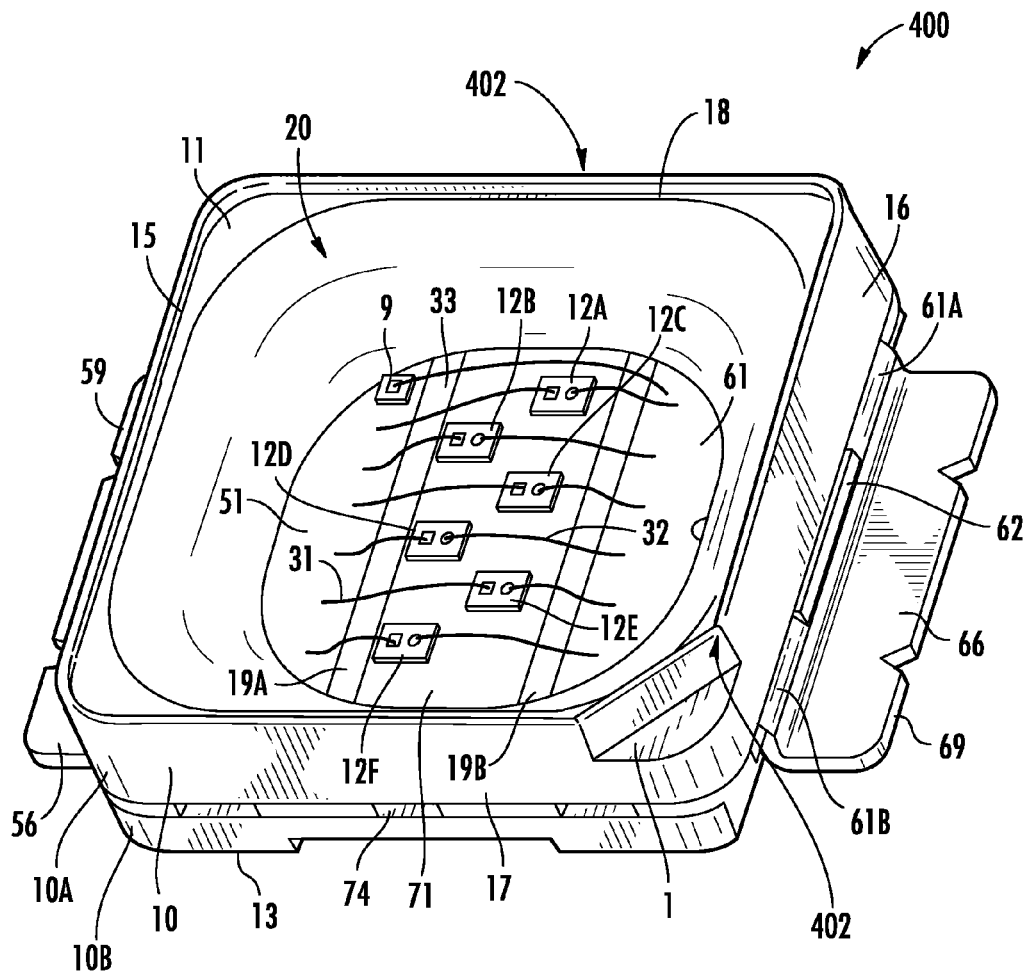
FIGS. 15A and 15B are top perspective views of a light emission package according to other embodiments of the present subject matter.
Figure 15B:
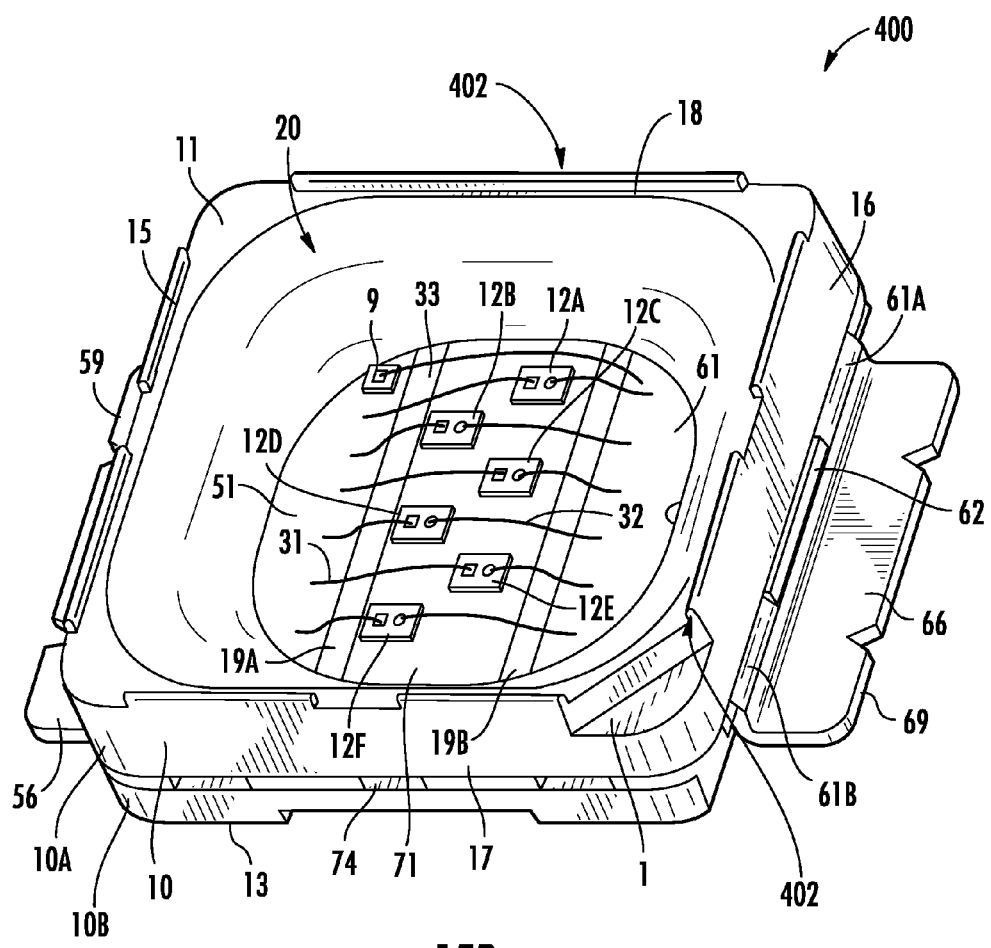

FIGS. 15A and 15B illustrate further embodiments of solid state light emission package, generally designated 400. These embodiments can contain several features having the same form and/or function as described earlier with respect to previous figures, such as FIGS. 1-9, and such features are denoted by like numbers. For example, package 400 can comprise, for example, six solid state emitters 12A to 12F mounted over a top surface 71 of thermal transfer material.

Each of the solid state emitters 12A to 12F can electrically communicate with electrical elements including first and second electrical leads 51 and 61. Each of the emitters 12A to 12F dissipates heat to electrically isolated thermal transfer material 70. Packager 400 can comprise an LED package having one or more solid state emitters 12A to 12F. Solid state emitters 12A to 12F can comprise LEDs. Package 400 can further comprise a rim portion 402 disposed at least partially over a portion of an upper surface of the package, for example, upper face 11 of body structure 10. Rim portion 402 can be of any size and/or shape, and although rim portion 402 is shown disposed about substantially all of the upper face 11 in FIG. 15A, it can be disposed about any suitable portion of upper face 11. As an example, rim portion 402 can be discontinuous and comprise a series of spaced-apart portions as shown in FIG. 15B that can be configured in any suitable arrangement. Rim portion 402 can be useful in decreasing the amount at which packages may stick to each other in processing, especially after dispensing encapsulant, which may be sticky, into a desired level of reflector cavity 20. Rim portion 402 can comprise a minimal height so as not to block light emission from the package. Although any suitable size and configuration can be used, rim portion 402 can in one aspect be, for example, less than approximately 200 um high and approximately 100 um wide. Rim portion 402 can also in one aspect be, for example, approximately 100 um high and approximately 50 um wide.

Figure 16A:
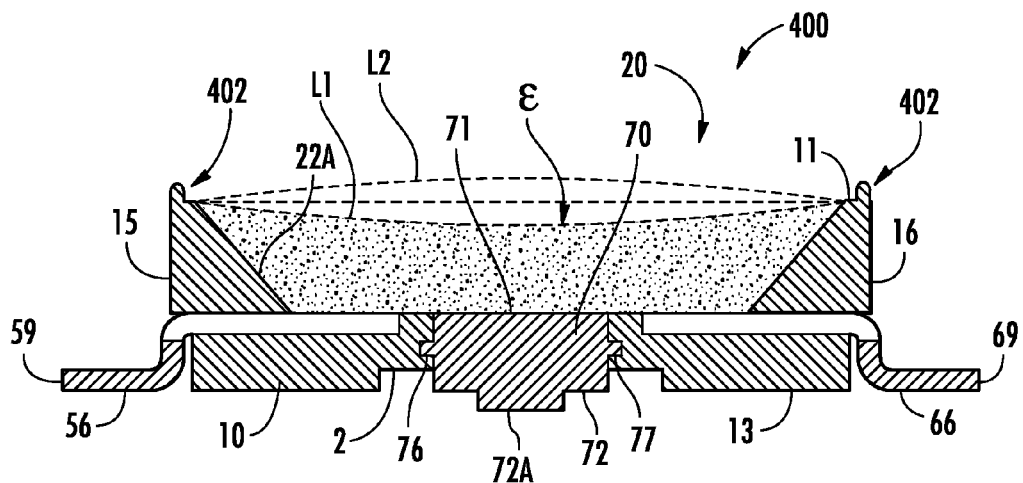
FIGS. 16A to 16C are cross-sectional views of light emission packages according to the embodiment shown in FIG. 15A showing various different configuration aspects.
Figure 16B:
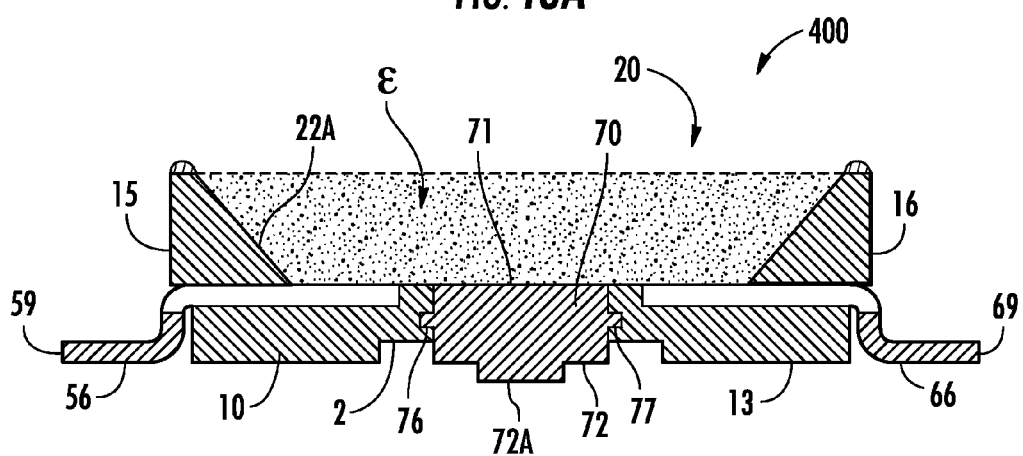
Figure 16C:
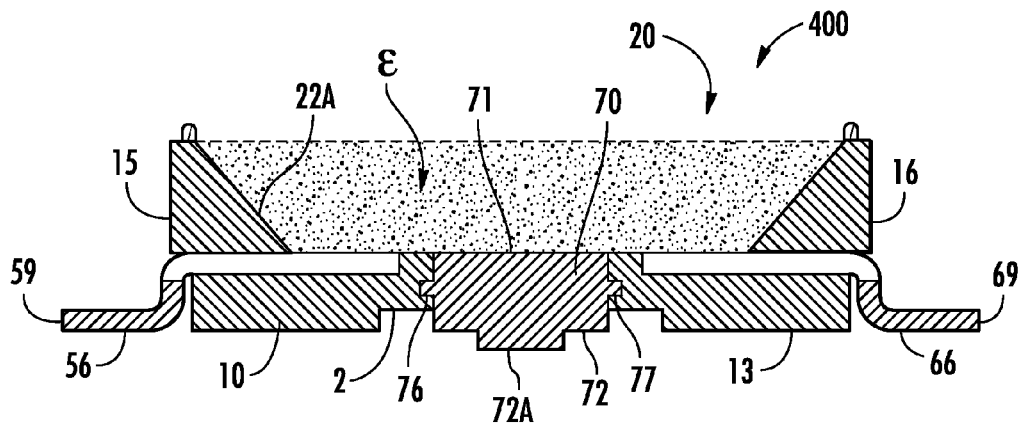

FIGS. 16A to 16C illustrate cross-sectional views of package 400 with different sizes, shapes and locations of rim portion 402. FIG. 16A illustrates one aspect of rim portion 402 disposed along an outermost portion of upper face 11 and comprises a substantially rounded cross-section of minimal height. The cross-sectional view illustrates encapsulant E disposed in wall 22A of cavity 20. Encapsulant E can be filled to any suitable level within wall 22A. In one aspect, encapsulant E can be filled to a level flat or even with upper face 11, which can be a ledge to which rim portion 402 can be attached or on which rim portion 402 can be formed. In other aspects, encapsulant E can be filled to a level having a very slight meniscus (convex or concave) that can be maintained, for example, within about 50 microns of upper face 11 as illustrated by L1 and L2, and as disclosed by commonly owned U.S. Patent Application Serial No. 2008/0054282, the content of which is incorporated by reference herein in its entirety. Filling encapsulant to a level of +/−50 microns from upper face 11 offers the uniformity benefits of a flat level of encapsulant E. The 50 micron dimension can be defined between the highest (or lowest) portion of the meniscus L1 and/or L2 and the top surface 11 of body structure 10.

FIG. 16B illustrates rim portion 402 disposed along the entire width of upper face 11 and comprises a substantially rounded cross-section of minimal height. FIG. 16C illustrates rim portion 402 disposed along an innermost portion of upper face 11 and comprising a substantially rounded cross-section of minimal height. Although the cross-sections illustrated by FIGS. 16A to 16C illustrated rounded rim portions 402, any suitable cross-sectional size and/or shape can be used. Rim portion 402 can be integrally formed with body structure 10 as illustrated by FIG. 16A, or rim portion 402 can be formed separate from and dispensed or otherwise fixedly attach to upper face 11. FIGS. 16B and 16C illustrate encapsulant E filled to a level flat with upper face 11 of body structure 10. However, encapsulant E can be filled to any level within inner wall 22A, for example, to meniscus levels L1 and L2 comprising +/−50 micron, from flat with upper face 11 as illustrated in FIG. 16A with a concave or convex configuration even.

As discussed previously, body structure 10 can comprise a white plastic material, more specifically, a molded white plastic material. In one aspect, body structure 10 can comprise any suitable moldable material. In another aspect, body structure 10 can comprise a plastic material having quantitative and qualitative properties optimized for solid state device package applications. The plastic material can in one aspect comprise, for example, any suitable organic polymer, such as for example a heat resistant resin such as a polyamide resin. The plastic material can be filled with glass or mineral material for strength and something like titanium dioxide for reflectivity.

Utilizing a plastic material such as described herein for body structure 10 allows for an advantageous softness for body structure 10 at operating temperatures as hardness can depend upon temperature. This softness allows body structure 10 to desirably have improved reliability and useful lifetime. The plastic material can in one aspect be a liquid crystal polymer (LCP). An optimized plastic material in accordance herewith can comprise a glass transition temperature ($T_g$) that can, for example, be greater than approximately 110 degrees Celsius (° C.). The glass transition temperature ($T_g$) can, for example, be greater than approximately 115° C. or greater than approximately 120° C. In one aspect, the glass transition temperature ($T_g$) can be greater than approximately 123° C. The optimized plastic material in accordance herewith can also comprise a melting point temperature ($T_m$) that can be less than approximately 315° C. The melting point temperature ($T_m$) can, for example, be less than approximately 310° C. The melting point temperature ($T_m$) can, for example, be less than approximately 300° C. In one aspect, the melting point temperature ($T_m$) can be approximately 307° C. A plastic material with a $T_g$ of approximately 123° C. is higher than many plastics conventionally used and can allow the package to have increased stability at elevated temperatures. A plastic material with a lower $T_m$ of approximately 307° C. can allow better flowability because the melting temperature is lower than that of plastics conventionally used and the plastic body is easier to mold. The plastic selected for body structure 10 can also comprise optimized qualitative properties. For example, a white plastic material can be chosen which exhibits a better reflectivity retention value while also exhibiting fewer tendencies to discolor, degrade, and/or yellow when subjected to heat and/or light exposure. The reflectivity of the plastic material can in one aspect be greater than 90% for example, and that level or another level of high reflectivity can be maintained over time, heat, moisture, and blue light exposure.

Other characteristics or features of the plastic material for body structure 10 can comprise an elongation value (mechanical property) of approximately 1.4% or greater, or an elongation value of 1.6% or greater. In one aspect, the elongation value can be approximately 1.5% or greater. Also as a mechanical property, the flexural strength of the plastic material of body structure 10 as measured by ASTM D790 standards can be approximately 150 MPa or lower, approximately 130 MPa or lower, or approximately 120 MPa or lower. In one aspect, the flexural strength of the plastic material of body structure 10 can be approximately 140 MPa or lower as measured by ASTM D790 standards. Also as a mechanical property, the flexural modulus of the plastic material of body structure 10 can be approximately 6.9 GPa or lower, or approximately 6.5 GPa or lower. In one aspect, the flexural modulus of the plastic material of body structure 10 can be approximately 6.0 GPa or lower. As yet another mechanical property, the tensile strength of the plastic material of body structure 10 can be approximately 100 MPa or lower as measured by ASTM D638 standards, approximately 90 MPa or lower, or approximately 80 MPa or lower. In one aspect, the tensile strength of the plastic material of body structure 10 can be less than approximately 75 MPa as measured by ASTM D638 standards.

Figure 17:
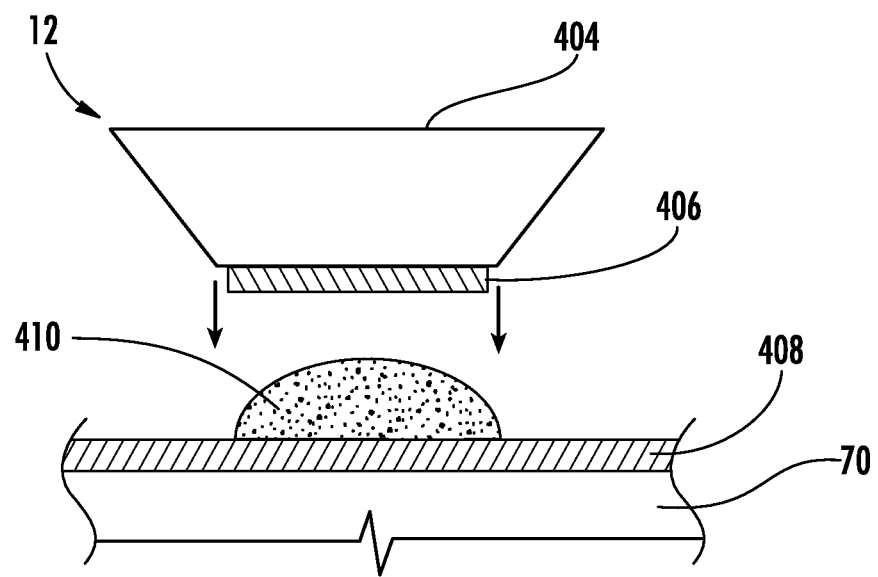
FIG. 17 illustrates a side view of a solid state emitting device and a light emission package according to the present subject matter.

FIG. 17 illustrates a side view of a solid state emitter, generally designated 12 as it would be positioned for mounting over thermal transfer material 70. Solid state emitter can comprise any one of solid state emitting devices 12A to 12F. One or more intervening substrates 408 may be positioned between solid state emitter 12 and thermal transfer material 70 or in the alternative, emitter 12 can mount directly to thermal transfer material 70. Solid state emitter can comprise an upper surface 404, which can have one or more bondpads disposed thereon for wirebonding to electrical elements, for example, first and second electrical leads (FIG. 1). Solid state emitter 12 can further comprise a backside metal pad or bonding layer 406 for mounting over thermal transfer material 70.

Any suitable die attach method can be used to mount solid state emitter 12 over thermal transfer material. In one aspect, any suitable optimized die attach method and/or materials can be used. For example, optimized die attach methods can comprise eutectic die attach, for example by using a dispensed amount of flux eutectic 410 and flux eutectic methods in combination with the optimized plastic body discussed earlier. Although eutectic die attach methods have previously been used in solid state device packages comprising ceramic substrates and package bodies, it is unexpected to use flux eutectic die attach techniques and/or materials in solid state device packages having molded plastic bodies. For example, it is quite unexpected to use eutectic die attach with molded plastic body structure 10 that has an optimized plastic material that can have, for example, a $T_m$ of approximately 307° C.

In one aspect, an optimized die attach method can comprise flux eutectic die attach for attaching solid state emitter 12 having a gold (Au) or Au alloy, for example, 80/20 Au/Sn alloy (Sn=Tin) bonding layer 406. The $T_m$ of an 80/20 Au/Sn bonding layer 406 is approximately 280° C. One consideration when choosing a material for use in eutectic die attach can be the melting point $T_m$ of the solid state chip bonding layer 406. A flux chosen for use can be liquid at room temperature or can require heating or melting to reach a melting point $T_m$. In one aspect, the body structure can comprise a plastic material having a melting point within approximately 28° C. or less of the eutectic temperature of the bonding layer. In one aspect, at least one LED can be mounted over the thermal transfer material at a mounting temperature of approximately 280° C. or greater. Body structure 10 can comprise a plastic material with a melting point of approximately 28° C. or less from the mounting temperature at which the at least one LED is mounted or attached. The melting point can be approximately 25° C. or less from the mounting temperature at which the at least one LED is mounted or attached, approximately 20° C. or less from the mounting temperature at which the at least one LED is mounted or attached, or even approximately 15° C. or less from the mounting temperature at which the at least one LED is mounted or attached. Using flux eutectic die attach in such a package is unexpected based upon this small temperature difference and the possibility that the plastic may begin to be adversely affected during the die attach process.

Flux eutectic die attach methods can be tedious, and therefore it is unexpected to use such methods when attaching solid state emitters within a molded plastic package body. The flux eutectic die attach according to the present subject matter can utilize dispensing flux 410, that can be liquid at room temperature, in an amount to be precisely the right volume to avoid either swimming of the emitter chips or poor die attach if too much or too little flux is used. Flux eutectic die attach according to the present subject matter can also require the right composition for each of the flux 410 and bonding metal 406 of the emitter chips. Flux eutectic die attach according to the present subject matter can optimally utilize a very clean and flat surface and substrates that do not move or bend during heating and cooling such to stress the solder joint. Flux eutectic according to the present subject matter can utilize a fine surface roughness that is small enough not to encumber the Au/Sn bonding surface of the emitter chips while being rough enough to allow flux to escape during heating. The heating profile can be matched perfectly to the bonding metal 406, such as Au or AuSn, to ensure a good weld between the bonding metal 406 and underlying substrate 408 and/or 70. Using flux eutectic for die attach according to the present subject matter also can utilize an inert atmosphere, such as a nitrogen atmosphere, to reduce oxygen gas ($O_2$) levels below 30 ppm, and also allow gravity to apply a downward force on the emitter 12. This can reduce the amount of oxidation at the metal-to-metal bond between bonding layer 406 and underlying substrate 408 or thermal transfer material 70.

Eutectic die attach methods can comprise direct die attach methods providing a direct metal-to-metal bond between an LED and underlying substrate, for example, a heat transfer material. An LED can be positioned on a top surface of heat transfer material, or an intervening substrate, and a flux material can be disposed therebetween. Flux can provide a conduit, or transfer material for facilitating a bond directly between bonding metal 406 of LED and underlying mounting substrate. The Au, AuSn, or any suitable bonding metal can atomically diffuse and bond with atoms of the underlying mounting substrate. Flux eutectic die attach can comprise several process techniques, for example, using a heated collet for dispensing the flux 410, heating the substrate and/or entire LED package, forming a gas, and applying pressure to the LED to the underlying mounting substrate. Methods can also comprise using a heated collet in combination with heating the mounting substrate and/or entire LED package and applying pressure. Body structure 10 can be heated quickly using microwave, laser, conduction and/or excitation fields, etc. all which can be done quickly and in an inert atmosphere allowing the body structure 10 to attain at least the eutectic temperature of the Au/Sn bonding metal on the LED solid state emitter (at least approximately 280° C.). Heating thereby facilitates adequate metal-to-metal bonding between the bonding layer 406 of emitter chips and underlying mounting substrate (e.g., 408 and/or 70) In one aspect, sonic scrubbing or thermo-sonic scrubbing techniques can also be used, as the friction of the scrubbing step can generate the heat required for metal-to-metal bonding. Flux die attach methods can also comprise plasma cleaning in an inert atmosphere before and/or after flux eutectic die attach.

In one aspect, the flux eutectic composition according to the present subject matter can comprise, for example, 55-65% rosin and 25-35% polyglycol ether in addition to small amounts of other components. Any suitable eutectic material can be used however. Any suitable methods, processes, and/or techniques for using any die attach method can be used in combination with body structure 10 comprising an optimized plastic material in accordance herewith. Light packages as described herein can, for example and without limitation, offer light output of up to 122 lumens at 300 mA in cool white, and up to 100 lumens at 300 mA in warm white. LED packages disclosed herein can also offer, for example, 80 CRI minimum in warm white for both standard and high voltage configurations.

Figure 18A:
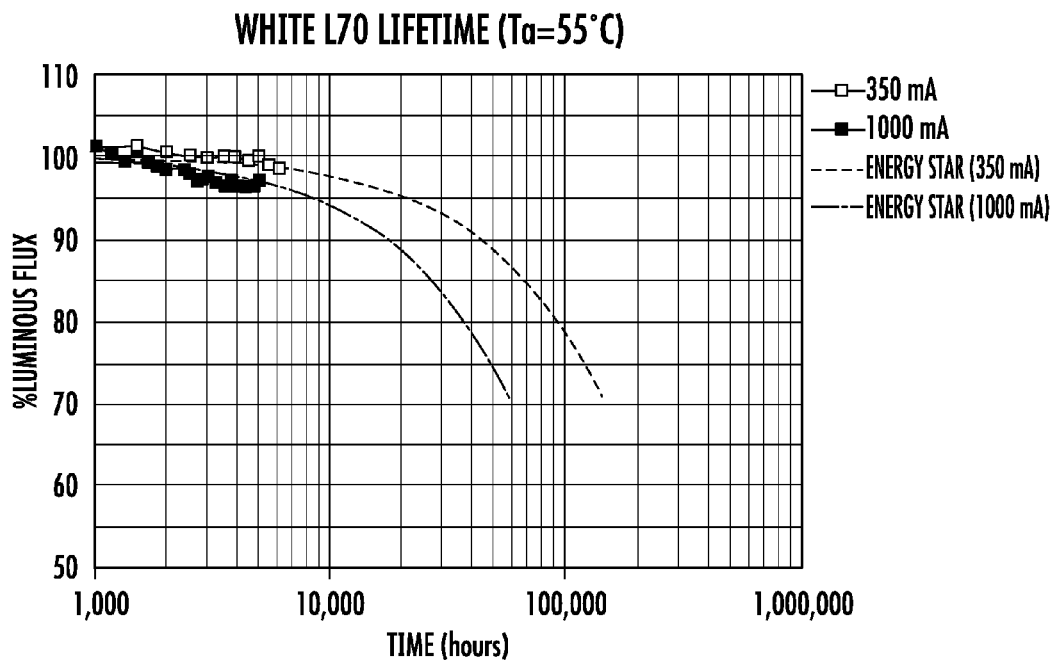
FIGS. 18A and 18B graphically illustrate measured and extrapolated long-term L70 lifetime values at two different ambient temperatures ($T_a$).
Figure 18B:
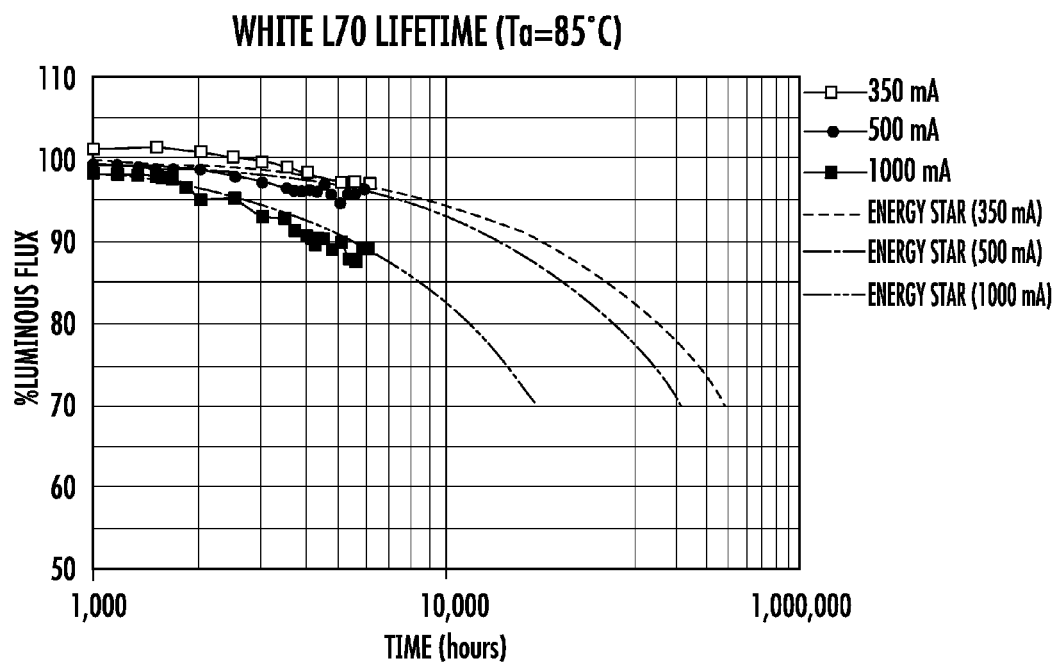

FIGS. 18A and 18B illustrate predicted long term white L70 lifetime values which can be expected using solid state device packages comprising, for example, optimized plastic and/or flux eutectic die attach methods and materials in accordance herewith. Lumen Maintenance life ($L_{XX}$) values represent the elapsed operating time over which the solid state lighting devices will maintain the percentage, XX %, of its initial light output. For example, L70 equals the time to 70% lumen maintenance in hours, that is, L70 equals the time to maintain 70% of its initial light output in hours. FIG. 18A illustrates the predicted mean white L70 lifetime measured and extrapolated at an ambient air temperature ($T_a$) of 55° C. FIG. 18B illustrates the predicted mean white L70 lifetime measured and extrapolated at $T_a$ of 85° C. The values represented by the white squares were measured at a current of 350 mA for 6,000 hours and then extrapolated to 70% using the ENERGY STAR exponential method fit to the last data point. The values represented by the black squares were measured at a current of 1000 mA for 6,000 and extrapolated to 70% using the same ENERGY STAR method fit to the last data point. In FIG. 18B, values represented by the black circle were measured at a current of 500 mA for 6,000 hours and then extrapolated to 70% using the ENERGY STAR method fit to the last data point. According to the measured data and extrapolations above, the L70 lifetime for the packages described herein can be approximately 150,000 hours or greater at 350 mA at 55° C. Table 1.0 below includes interpolated values of data for 55° C. as illustrated in FIG. 18A, and the interpolated values are designated by an asterisk (*).

TABLE 1.0

| Current (mA) | Ta (° C.) | L70 (hours) |
|---|---|---|
| 350 | 55 | 150,696 |
| 400 | 55 | 140,508* |
| 500 | 55 | 122,151* |
| 600 | 55 | 106,193* |
| 700 | 55 | 92,320* |
| 800 | 55 | 80,259* |
| 900 | 55 | 69,774* |
| 1000 | 55 | 60,659 |

The light emission package according to the present subject matter can therefor be operable to emit light with an output of approximately 70% or greater of an initial light output for at least approximately 150,000 hours or more. That is, under normal operating conditions, the packages disclosed herein can provide L70 lifetime of over 150,000 hours, or 17 years, using ENERGY STAR lifetime prediction methods. Similarly and according to the data and extrapolations above, the L70 lifetime for the packages described herein can be approximately 61,000 hours at 350 mA at 85° C.

Table 2.0 below includes interpolated values of data for 85° C. as illustrated in FIG. 18B, and the interpolated values are designated by an asterisk (*).

TABLE 2.0

| Current (mA) | Ta (° C.) | L70 (hours) |
|---|---|---|
| 350 | 85 | 61,143 |
| 400 | 85 | 55,602* |
| 500 | 85 | 45,980* |
| 600 | 85 | 38,024* |
| 700 | 85 | 31,444* |

TABLE 2.0-continued

| Current (mA) | Ta (° C.) | L70 (hours) |
|---|---|---|
| 800 | 85 | 26,003* |
| 900 | 85 | 21,503* |
| 1000 | 85 | 17,782 |

One or more solid state emitter packages as described herein may be integrated into lighting apparatuses of varying type, including LCD displays and backlights therefor. In one embodiment, an enclosure comprises an enclosed space and at least one solid state emitter package or lighting device as disclosed herein, wherein upon supply of current to a power line, the at least one lighting device illuminates at least one portion of the enclosed space. In another embodiment, a structure comprises a surface and at least one solid state emitter package or lighting device as disclosed herein, wherein upon supply of current to a power line, the lighting device illuminates at least one portion of the surface. In another embodiment, a solid state emitter package or lighting device as disclosed herein may be used to illuminate an area comprising at least one of the following: a swimming pool, a room, a warehouse, an indicator, a road, a vehicle, a road sign, a billboard, a ship, a toy, an electronic device, a household or industrial appliance, a boat, and aircraft, a stadium, a tree, a window, a yard, and a lamppost. In further embodiments, the solid state emitter package or lighting device as disclosed herein may be used for direct light, indirect light, and/or backlighting applications.

While the subject matter has been has been described herein in reference to specific aspects, features and illustrative embodiments of the subject matter, it will be appreciated that the utility of the subject matter is not thus limited, but rather extends to and encompasses numerous other variations, modifications and alternative embodiments, as will suggest themselves to those of ordinary skill in the field of the present subject matter, based on the disclosure herein. Correspondingly, the subject matter as hereinafter claimed is intended to be broadly construed and interpreted, as including all such variations, modifications and alternative embodiments, within the scope of this disclosure.

What is claimed is:

1. A light emission package, the package comprising:
   a leadframe comprising at least one electrical lead;
   a body structure encasing at least a portion of the leadframe;
   at least one light emitting diode (LED) with a bonding layer mounted to the light emission package at approximately a eutectic temperature of the bonding layer; and
   the body structure comprising a plastic material having a melting point within approximately 28° Celsius (C) or less of the eutectic temperature of the bonding layer.

2. The light emission package of claim 1, wherein the bonding layer comprises a Au/Sn alloy.

3. The light emission package of claim 1, wherein the bonding layer comprises an 80/20 Au/Sn alloy and the eutectic temperature of the bonding layer is approximately 280° C.

4. The light emission package of claim 1, comprising a thermal transfer material retained by the body structure and electrically isolated from the at least one electrical lead.

5. The light emission package of claim 4, wherein the at least one LED comprises six LEDs mounted over the thermal transfer material.

6. The light emission package of claim 1, wherein the plastic material comprises a melting point temperature ($T_m$) less than approximately 315° C.

7. The light emission package of claim 6, wherein the plastic material comprises a melting point ($T_m$) of approximately 307° C.

8. The light emission package of claim 1, wherein the plastic material comprises a glass transition temperature ($T_g$) greater than approximately 110° C.

9. The light emission package of claim 8, wherein the plastic material comprises a glass transition temperature ($T_g$) of approximately 123° C.

10. The light emission package of claim 1 wherein the plastic material comprises: an elongation value of approximately 1.4% or greater; a flexural strength as measured by ASTM D790 standards of approximately 150 MPa or lower; a flexural modulus of approximately 6.9 GPa or lower; and/or a tensile strength of approximately 100 MPa or lower as measured by ASTM D638 standards.

11. The light emission package of claim 1, wherein the at least one electrical lead comprises a bent portion.

12. The light emission package of claim 4, wherein the thermal transfer material has an average thickness that is substantially greater than an average thickness of the leadframe.

13. The light emission package of claim 1, wherein a first electrical lead of the at least one electrical lead comprises a plurality of first electrical lead segments extending through at least one exterior side wall, and wherein each first electrical lead segment is separated from each other first electrical lead segment along the at least one exterior side wall by at least one first aperture, and at least a portion of the at least one first aperture is disposed outside the at least one exterior wall.

14. The light emission package of claim 1, wherein the at least one electrical lead comprises a distal portion extending away from at least one exterior side wall in a direction outward from a center portion of the package.

15. The light emission package of claim 14, wherein the at least one electrical lead comprises a first and second electrical lead, each of first and second electrical leads comprising a distal portion extending outward from the center portion of the package.

16. The light emission package of claim 1, wherein the body structure comprises a rim portion disposed at least partially over an upper surface of the body structure.

17. The light emission package of claim 1, wherein the primary bond between the LED and an underlying mounting substrate comprises a direct metal-to-metal bond.

18. The light emission package of claim 1, wherein the package is operable to emit light with an output of approximately 70% or greater of an initial light output for an extrapolated time of at least approximately 150,000 hours or more.

19. A method of fabricating a light emission package, the method comprising:
 providing a leadframe comprising at least one electrical lead;
 mounting at least one light emitting diode (LED) with a bonding layer over the light emission package at approximately a eutectic temperature of the bonding layer; and
 encasing a body structure about at least a portion of the leadframe, the body structure comprising a plastic body structure with a melting point within approximately 28° Celsius or less of the eutectic temperature of the bonding layer.

20. The method of claim 19, wherein encasing a body structure about at least a portion of the leadframe comprises molding the plastic body structure about at least a portion of the leadframe.

21. The method of claim 19, wherein providing a leadframe comprises providing a leadframe comprising at least first and second electrical leads, and further comprising providing a thermal transfer material electrically isolated from the first and second electrical leads.

22. The method of claim 19, wherein mounting the at least one LED comprises facilitating a direct metal-to-metal bond between the bonding layer of the LED and an underlying mounting substrate.

23. A light emission package, the package comprising:
 a leadframe comprising at least one electrical lead;
 a body structure encasing at least a portion of the leadframe;
 at least one light emitting diode (LED) mounted over the light emission package at a mounting temperature of approximately 280° Celsius or greater; and
 the body structure comprising a plastic material with a melting point of approximately 28° Celsius or less from the mounting temperature.

24. The light emission package of claim 23, further comprising a thermal transfer material retained by the body structure and electrically isolated from the at least one electrical lead.

25. The light emission package of claim 24, wherein the at least one LED comprises six LEDs mounted over the thermal transfer material.

26. The light emission package of claim 23, wherein the plastic material comprises a melting point temperature ($T_m$) less than approximately 315° C.

27. The light emission package of claim 26, wherein the plastic material comprises a melting point ($T_m$) of approximately 307° C.

28. The light emission package of claim 23, wherein the plastic material comprises a glass transition temperature ($T_g$) greater than approximately 110° C.

29. The light emission package of claim 28, wherein the plastic material comprises a glass transition temperature ($T_g$) of approximately 123° C.

30. The light emission package of claim 24, wherein the thermal transfer material is electrically isolated from a first and second electrical lead.

31. The light emission package of claim 23, wherein the body structure comprises a rim portion disposed at least partially over an upper surface of body structure.

32. The light emission package of claim 23, wherein the primary bond between the LED and an underlying mounting substrate comprises a direct metal-to-metal bond.

33. The light emission package of claim 23, wherein the package is operable to emit light with an output of approximately 70% or greater of an initial light output for an extrapolated time of at least approximately 150,000 hours or more.

34. The light emission package of claim 23, wherein the plastic material comprises: an elongation value of approximately 1.4% or greater; a flexural strength as measured by ASTM D790 standards of approximately 150 MPa or lower; a flexural modulus of approximately 6.9 GPa or lower; and/or a tensile strength of approximately 100 MPa or lower as measured by ASTM D638 standards.

35. A method of fabricating a light emission package, the method comprising:
 providing a leadframe comprising at least one electrical lead;
 mounting at least one light emitting diode (LED) over the light emission package at a mounting temperature of approximately 280° C. or greater; and
 forming a body structure about at least a portion of the leadframe, the body structure comprising a plastic body structure having a melting point of approximately 28° C. or less from the mounting temperature.

36. A light emission package fabricated by the method according to claim 35, wherein the light emission package is operable to emit light with an output of approximately 70% or greater of an initial output for at least approximately 150,000 hours or more.

37. The method of claim 35, wherein encasing a body structure about at least a portion of the leadframe comprises molding the plastic body structure about at least a portion of the leadframe.

38. The method of claim 35, wherein providing a leadframe comprises providing a leadframe comprising at least first and second electrical leads, and further comprising providing a thermal transfer material electrically isolated from the first and second electrical leads.

39. The method of claim 35, wherein mounting the at least one LED comprises facilitating a direct metal-to-metal bond between a bonding layer of the LED and an underlying mounting substrate.

40. A light emission package, the package comprising:
a leadframe comprising at least one electrical lead;
a body structure encasing at least a portion of the leadframe;
a thermal transfer material retained by the body structure and electrically isolated from the at least one electrical lead;
at least one light emitting diode (LED) with a bonding layer mounted over the light emission package at a eutectic temperature of the bonding layer; and
the light emission package being operable to emit light with an output of approximately 70% or greater of an initial light output for at least approximately 150,000 hours or more.

41. The light emission package of claim 40, wherein the output of approximately 70% or greater of the initial light output for at least approximately 150,000 hours or more is extrapolated from data measured using a current of 350 mA and an ambient air temperature (Ta) of 55° C.

42. The light emission package of claim 40, wherein the bonding layer comprises a Au/Sn alloy.

43. The light emission package of claim 42, wherein the bonding layer comprises an 80/20 Au/Sn alloy and the eutectic temperature of the bonding layer is approximately 280° C.

44. The light emission package of claim 40, wherein the at least one LED comprises six LEDs mounted over the thermal transfer material.

45. The light emission package of claim 40, wherein the body structure comprises a plastic material.

46. The light emission package of claim 45, wherein the plastic material comprises a melting point temperature ($T_m$) less than approximately 315° C.

47. The light emission package of claim 46, wherein the plastic material comprises a melting point ($T_m$) of approximately 307° C.

48. The light emission package of claim 45, wherein the plastic material comprises a glass transition temperature ($T_g$) greater than approximately 110° C.

49. The light emission package of claim 48, wherein the plastic material comprises a glass transition temperature ($T_g$) of approximately 123° C.

50. The light emission package of claim 40, wherein the at least one electrical lead comprises first and second electrical leads, and the thermal transfer material is electrically isolated from each of the first and second electrical leads.

51. The light emission package of claim 40, wherein the body structure comprises a rim portion disposed at least partially over an upper surface of body structure.

52. The light emission package of claim 40, wherein the primary bond between the LED and an underlying mounting substrate comprises a direct metal-to-metal bond.

53. The light emission package of claim 45, wherein the plastic material comprises: an elongation value of approximately 1.4% or greater; a flexural strength as measured by ASTM D790 standards of approximately 150 MPa or lower; a flexural modulus of approximately 6.9 GPa or lower; and/or a tensile strength of approximately 100 MPa or lower as measured by ASTM D638 standards.

54. A light emission package, the package comprising:
a leadframe comprising at least one electrical lead;
a body structure encasing at least a portion of the leadframe;
a thermal transfer material retained by the body structure and electrically isolated from the at least one electrical lead;
at least one light emitting diode (LED) mounted over the light emission package; and
the light emission package operable to emit light with an output of approximately 70% or greater of an initial light output for at least approximately 150,000 hours or more.

55. The light emission package of claim 54, wherein the at least one LED comprises six LEDs mounted over the thermal transfer material.

56. The light emission package of claim 54, wherein the at least one LED is mounted over the thermal transfer material using a metal-to-metal bond facilitated using a flux eutectic die attach.

57. The light emission package of claim 54, wherein the body structure comprises a plastic material comprising a melting point temperature ($T_m$) less than approximately 315° C.

58. The light emission package of claim 57, wherein the plastic material comprises a melting point ($T_m$) of approximately 307° C.

59. The light emission package of claim 54, wherein body structure comprises a plastic material comprising a glass transition temperature ($T_g$) greater than approximately 110° C.

60. The light emission package of claim 59, wherein the plastic material comprises a glass transition temperature ($T_g$) of approximately 123° C.

61. The light emission package of claim 54, wherein the plastic material comprises: an elongation value of approximately 1.4% or greater; a flexural strength as measured by ASTM D790 standards of approximately 150 MPa or lower; a flexural modulus of approximately 6.9 GPa or lower; and/or a tensile strength of approximately 100 MPa or lower as measured by ASTM D638 standards.

62. A light emission package, the package comprising:
a leadframe comprising at least one electrical lead;
a body structure encasing at least a portion of the leadframe;
at least one light emitting diode (LED) mounted over the light emission package, wherein the at least one LED is mounted over the thermal transfer material using a metal-to-metal bond facilitated using a flux eutectic die attach; and
the light emission package operable to emit light with an output of approximately 70% or greater of an initial light output for an extrapolated time of at least approximately 150,000 hours or more.

63. The light emission package of claim 62, further comprising a thermal transfer material retained by the body structure and electrically isolated from the at least one electrical lead.

64. The light emission package of claim 63, wherein the at least one LED comprises six LEDs mounted over the thermal transfer material.

65. The light emission package of claim 62, wherein the body structure comprises a plastic material.

66. The light emission package of claim 65, wherein the plastic material comprises a melting point temperature ($T_m$) less than approximately 315° C.

67. The light emission package of claim 66, wherein the plastic material comprises a melting point ($T_m$) of approximately 307° C.

68. The light emission package of claim 65, wherein the plastic material comprises a glass transition temperature ($T_g$) greater than approximately 110° C.

69. The light emission package of claim 68, wherein the plastic material comprises a glass transition temperature ($T_g$) of approximately 123° C.

70. The light emission package of claim 65, wherein the plastic material comprises: an elongation value of approximately 1.4% or greater; a flexural strength as measured by ASTM D790 standards of approximately 150 MPa or lower; a flexural modulus of approximately 6.9 GPa or lower; and/or a tensile strength of approximately 100 MPa or lower as measured by ASTM D638 standards.

71. A light emission package, the package comprising:
a leadframe comprising at least one electrical lead; and
a body structure encasing at least a portion of the leadframe, the body structure comprising a rim portion disposed at least partially over an upper surface of body structure.

72. The light emission package of claim 71, further comprising a thermal transfer material retained by the body structure and electrically isolated from the at least one electrical lead.

73. The light emission package of claim 72, wherein the thermal transfer material is electrically isolated from each of the first and second electrical leads.

74. The light emission package of claim 71, wherein the leadframe comprises a first and a second electrical lead.

75. The light emission package of claim 71, wherein the first and second electrical leads extend outwardly from a center portion of the body structure.

76. The light emission package of claim 71, wherein the body structure comprises a molded plastic.

77. The light emission package of claim 71, further comprising an encapsulant dispensed within the body structure to a level flush with upper surface of body structure.

78. The light emission package of claim 71, wherein the rim portion is disposed along an outermost edge portion of the upper surface.

* * * * *